United States Patent
Lloyd et al.

(10) Patent No.: US 11,616,313 B2
(45) Date of Patent: Mar. 28, 2023

(54) GRID ARRAY CONNECTOR SYSTEM

(71) Applicant: Molex, LLC, Lisle, IL (US)

(72) Inventors: Brian Keith Lloyd, Maumelle, AR (US); Gregory Walz, Maumelle, AR (US); Colby Waggener, Little Rock, AR (US); Karen Hille, Camarillo, CA (US); Bruce Reed, Maumelle, AR (US); Sagar Dalvi, Tracy, CA (US); Chitaou Tsai, Chandler, AR (US)

(73) Assignee: Molex, LLC, Lisle, IL (US)

( * ) Notice: Subject to any disclaimer, the term of this patent is extended or adjusted under 35 U.S.C. 154(b) by 0 days.

(21) Appl. No.: 17/546,054

(22) Filed: Dec. 9, 2021

(65) Prior Publication Data

US 2022/0102881 A1   Mar. 31, 2022

Related U.S. Application Data

(63) Continuation of application No. 16/784,270, filed on Feb. 7, 2020, now Pat. No. 11,205,867, which is a continuation-in-part of application No. 16/624,294, filed as application No. PCT/US2018/051327 on Sep. 17, 2018, now Pat. No. 10,939,555.

(60) Provisional application No. 62/658,820, filed on Apr. 17, 2018, provisional application No. 62/559,114, filed on Sep. 15, 2017.

(51) Int. Cl.
| | |
|---|---|
| *H01R 12/00* | (2006.01) |
| *H01R 12/53* | (2011.01) |
| *H01R 13/6594* | (2011.01) |
| *H05K 1/18* | (2006.01) |
| *H05K 1/11* | (2006.01) |
| *H01L 23/367* | (2006.01) |

(52) U.S. Cl.
CPC ......... *H01R 12/53* (2013.01); *H01L 23/3672* (2013.01); *H01R 13/6594* (2013.01); *H05K 1/117* (2013.01); *H05K 1/184* (2013.01); *H05K 2201/10189* (2013.01); *H05K 2201/10378* (2013.01)

(58) Field of Classification Search
CPC . H01R 12/53; H01R 13/6594; H01L 23/3672; H05K 1/117; H05K 1/184; H05K 2201/10378; H05K 2201/10189
USPC ...................................................... 439/55, 78
See application file for complete search history.

(56) References Cited

U.S. PATENT DOCUMENTS

| | | | |
|---|---|---|---|
| 4,743,205 | A | 5/1988 | Mitani et al. |
| 5,046,966 | A | 9/1991 | Snyder et al. |
| 6,304,450 | B1 | 10/2001 | Dibene, II et al. |

(Continued)

FOREIGN PATENT DOCUMENTS

| | | |
|---|---|---|
| CN | 2548285 Y | 4/2003 |
| CN | 107078425 A | 8/2017 |

(Continued)

OTHER PUBLICATIONS

Non Final Rejection received for U.S. Appl. No. 17/187,896, dated Feb. 16, 2022, 09 Pages.

(Continued)

*Primary Examiner* — Khiem M Nguyen

(57) ABSTRACT

A compute system is provided that includes cables that are terminated to a grid array connector that is mounted on a substrate that has an integrated circuit packaged mounted thereon. The cables include conductors that are electrically connected to the integrated circuit via terminals supposed by the substrate.

10 Claims, 52 Drawing Sheets

(56) References Cited

U.S. PATENT DOCUMENTS

| | | |
|---|---|---|
| 6,335,487 B1 | 1/2002 | Ullrich |
| 6,341,962 B1 | 1/2002 | Sinclair |
| 6,380,485 B1 | 4/2002 | Beaman et al. |
| 6,452,113 B2 | 9/2002 | Dibene, II et al. |
| 6,575,761 B1 | 6/2003 | Regnier |
| 6,575,772 B1 | 6/2003 | Soubh et al. |
| 6,847,529 B2 | 1/2005 | Dibene, II et al. |
| 7,320,426 B2 | 1/2008 | Shue et al. |
| 8,007,288 B2 | 8/2011 | Yetter et al. |
| 8,777,637 B2 | 7/2014 | Sun et al. |
| 9,590,338 B1 | 3/2017 | Schmitt et al. |
| 2004/0049914 A1 | 3/2004 | Wang |
| 2009/0120668 A1 | 5/2009 | Fjelstad et al. |
| 2010/0325882 A1 | 12/2010 | Dibene, II et al. |
| 2011/0021041 A1 | 1/2011 | Galloway et al. |
| 2013/0109242 A1 | 5/2013 | Li et al. |
| 2013/0280955 A1 | 10/2013 | Alden, III et al. |
| 2014/0027157 A1 | 1/2014 | Yu et al. |
| 2015/0034358 A1 | 2/2015 | Armbrecht et al. |
| 2016/0056553 A1 | 2/2016 | Brubaker et al. |
| 2016/0093966 A1 | 3/2016 | Behziz et al. |
| 2016/0181714 A1 | 6/2016 | Chawla et al. |
| 2017/0181285 A1 | 6/2017 | Regnier |
| 2019/0148858 A1 | 5/2019 | Mason et al. |

FOREIGN PATENT DOCUMENTS

| | | |
|---|---|---|
| CN | 209982516 U | 1/2020 |
| CN | 214627722 U | 11/2021 |
| JP | 2006156832 A | 6/2006 |
| JP | 2010153321 A | 7/2010 |
| JP | 2013045618 A | 3/2013 |
| TW | I597896 B | 9/2017 |
| WO | 2014160664 A1 | 10/2014 |
| WO | 2019055911 A1 | 3/2019 |

OTHER PUBLICATIONS

Office Action received for CN Application No. 202110162282.5, dated Jul. 5, 2022, 10 Pages (05 Pages of English Translation and 05 Pages of Official notification).

Decision of Refusal received for JP Application No. 2020-514203, dated Dec. 14, 2021, 14 Pages ( 07 Pages of English Translation and 07 Pages of Official notification).

International Preliminary Report on Patentability received for PCT Application No. PCT/US2018/051327, dated Mar. 26, 2020, 8 Pages.

International Search Report and Written Opinion received for PCT Application No. PCT/US2018/051327, dated Jan. 7, 2019, 11 Pages.

JP Notice of Reasons for Refusal received for Application No. 2020-514203, dated Apr. 20, 2021, 14 pages (7 pages of English translation and 7 pages Original document).

Non Final Office action received for U.S. Appl. No. 16/784,270, dated May 5, 2021, 7 pages.

Notice of allowance received for U.S. Appl. No. 16/624,294, dated Oct. 6, 2020, 12 pages.

Office Action received for JP Application No. 2021-010150, dated Jan. 4, 2022, 10 Pages (05 Pages of English Translation and 05 Pages of Official notification).

Office Action received for KR Application No. 10-2020-7010761, dated Aug. 15, 2021, 11 Pages (06 Pages of English Translation and 05 Pages of Official notification).

GRID ARRAY CONNECTOR SYSTEM

RELATED APPLICATIONS

This application is a continuation of U.S. application Ser. No. 16/784,270, filed on Feb. 7, 2020, which is incorporated herein by reference in its entirety and which is a continuation-in-part application of U.S. application Ser. No. 16/624,294, filed on Dec. 18, 2019, which is a National Stage filing of PCT Application No. PCT/US2018/051327, filed on Sep. 17, 2018, which claims priority to U.S. Provisional Application No. 62/559,114, filed Sep. 15, 2017, and U.S. Provisional Application No. 62/658,820, filed Apr. 17, 2018.

TECHNICAL FIELD

This disclosure relates to the field of connector systems, more specifically to a connector system suitable for use in high data rate applications.

DESCRIPTION OF RELATED ART

Historically, compute boxes provided a processor of some sort (provided in a chip package) and connectors on a front panel of the box. Both the connectors and the processor were mounted on a circuit board (often known as the mother board) and the circuit board included traces that connected the connectors to the processor so that information could be provided between the connectors and the processor. Unfortunately, as data rates have increased this well-known system design has become difficult to use due to losses in the circuit board.

Bypass connectors system are known to provide a connection between an input/output (JO) connector and an integrated circuit such as, without limitation, an application specific integrated circuit (ASIC) provided in a chip package. One common configuration is to have a first connector (typically an JO connector) at a face panel of a box while having a second connector that mates to a circuit board (or another connector) near the chip package with the first and second connectors connected via a cable. As known, the cable is much less lossy than standard circuit boards and the use of a cable substantially decreases the loss between the first and second connector. While such a situation is well suited for 56 Gbps applications, particularly applications that use pulse amplitude level 4 (PAM 4) encoding, as data rates increase toward 112 Gbps (using PAM 4 encoding) it becomes more challenging to keep the insertion loss low enough to support a useful channel length. Certain options provide good electrical performance but are difficult to assemble and thus create process issues when attempting to build an assembly (such as a 1 U server). As a result, certain individuals would appreciate a connector system that would allow a connection to a chip package that has low loss and still allowing for ease of assembly.

SUMMARY

A grid array connector system is disclosed that has conductors from a plurality of cables directly terminated to a board. The conductors can be attached to a support via a welding operation and pedestals are securely mounted on the board. Conductors in the cables are connected to a signal pads in a connecting surface of the board. The board can be configured to be attached to a chip substrate via a solder operation that connects pads on the connecting surface of the board to pads on the chip substrate in a grid and the grid array connector system can include solder charges on the pads on the connecting surface. The signal pads can be arranged in differential pairs and can be partially surrounded by ground pads. The signal pads in the board can be connected to the support via by a short trace that allows the pads to be positioned in a desirable pattern or the support via itself can act as the signal pad. A housing can be formed directly over the cables and at least a portion of the board to provide a structure that provides strain relief for the cables and helps support the board.

Another grid array connector system has an internal design similar to the above grid array connector system and but is configured as a socket so that a chip package can be mounted directly to the board or interposer (if an interposer is used).

An embodiment of a grid array connector system includes a housing that mounts over a grid of cables and includes a board. A first pedestal is mounted to the board. The cables are connected to a second pedestal and the second pedestal is inserted into the first pedestal that is attached to a board to form an array of pedestals on the board. The array of pedestals and corresponding cables can be potted on to the board. The conductors are connected to a signal pads in a connecting surface in the board and the pattern of the conductors may be different than the signal pads as they can be shifted in the connecting surface through the use of short traces. The pedestals are connected together electrically and also electrically connected to a ground plane on the mounting surface that is in turn connected to one or more ground pads in the connecting surface. The board can be directly soldered to a chip substrate that supports a chip package. The board can also be connected to the chip substrate via an interposer. The interposer can include contacts that extend between a first array of pads on the board to a second array of pads on the chip substrate.

In one embodiment the interposer can be soldered to the board and either have a solder connection to a substrate (or circuit board) or have deflecting contacts that can engage other pads that can be provided on a circuit board or substrate.

In an embodiment a grid array connector system is configured to include an interposer with deflectable contacts that are configured to engage pads on a mating surface of a chip substrate that includes a chip package and a first grid array connector is positioned on a first side of the chip package. A compression member can be positioned on a pressing side of a housing of the first grid array connector system. A second grid array connector system can be positioned on a second side of the chip package. A heat sink can be mounted on a chip package and the compression members of the respective grid array connector systems ensure that the grid array connector systems are pressed down by the heat sink so as to make electrical connection with pads on the mating surface while allowing the interface between the heat sink and the chip package to control the relative vertical or z-axis position.

A grid array connector system is provided that includes cables that are mounted on a board which has a chip packaged mounted thereon. The cables include conductors that are connected to support vias positioned in openings in the board and the conductors are connected to the support vias. The board can be connected to a second board which provides a stiffening ring. The board can be connected to the second board by deflectable terminals which are press-fit into the second board.

BRIEF DESCRIPTION OF THE DRAWINGS

The present application is illustrated by way of example and not limited in the accompanying figures in which like reference numerals indicate similar elements and in which:

FIG. 53 is a top perspective view of components of the compute system shown in FIG. 49.

DETAILED DESCRIPTION

Figure 1:
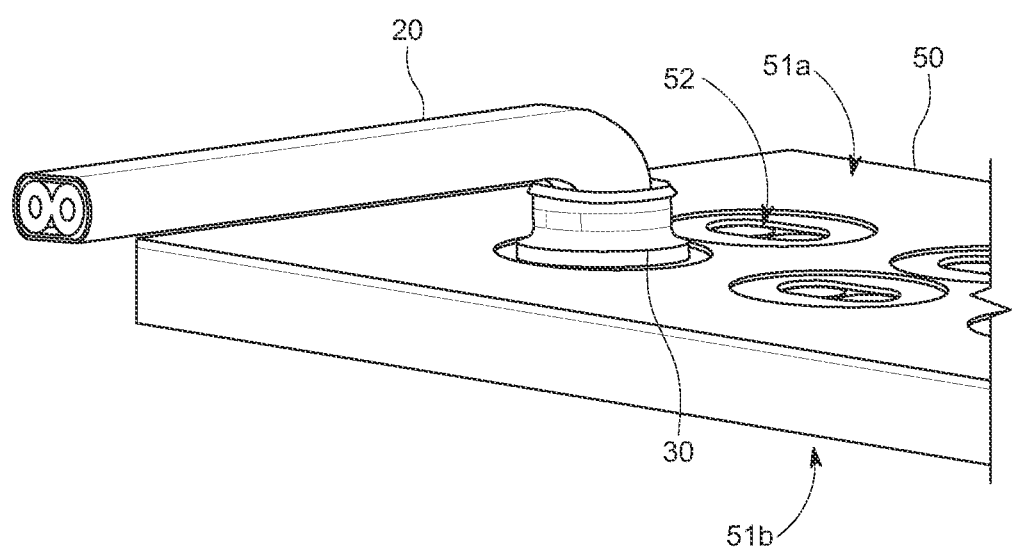
FIG. 1 illustrates a perspective view of an embodiment of a cable terminated to a board.
Figure 2:
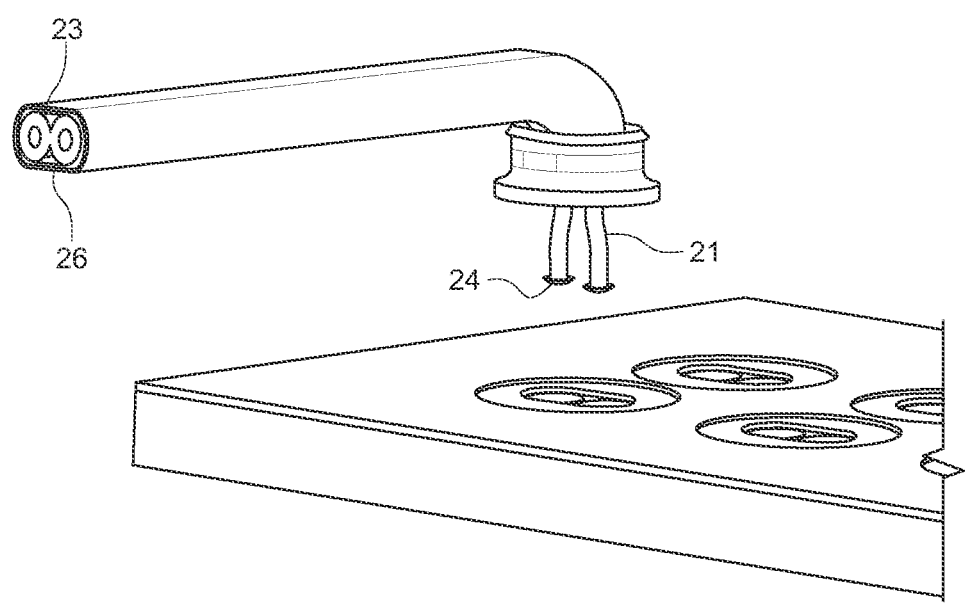
FIG. 2 illustrates a perspective view of a partially exploded view of the embodiment depicted in FIG. 1.
Figure 3:
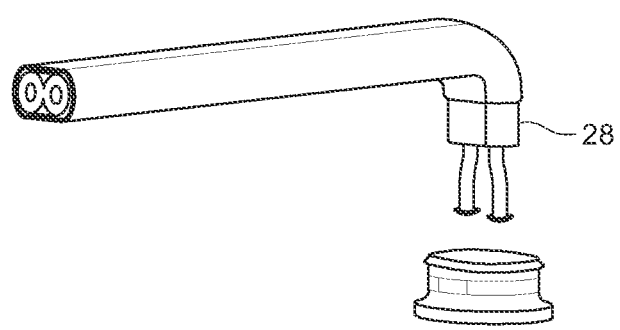
FIG. 3 illustrates a perspective view of an exploded simplified view of an embodiment of cable and pedestal that could be connected together.
Figure 4:
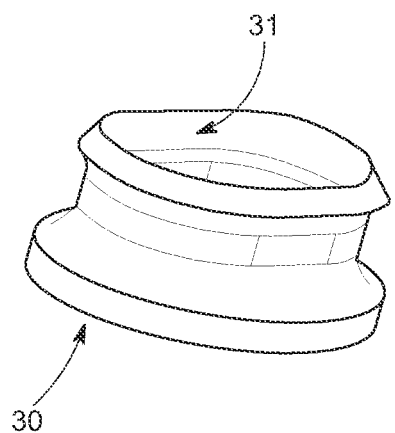
FIG. 4 illustrates a perspective view of an embodiment of a pedestal.

The detailed description that follows describes exemplary embodiments and the features disclosed are not intended to be limited to the expressly disclosed combination(s). Therefore, unless otherwise noted, features disclosed herein may be combined together to form additional combinations that were not otherwise shown for purposes of brevity.

As can be appreciated from FIGS. 1-7, features of an embodiment are disclosed that allow for terminating a cable 20 directly to a board 50, which could be a conventional circuit board or any other desirable substrate such as, without limitation, a ceramic and/or plastic metal composite structure. The board 50 including a mounting surface 51a and a connecting surface 51b with one or more connecting passages 52 extended between the mounting surface 51a and the connecting surface 51b. While terminating one or two conductors from one cable to a substrate can be accomplished in a wide range of methods, it becomes more complicated when attempting to terminate a larger number of cables in a compact array, especially if good electrical performance is desired while providing desirable manufacturing processing flexibility. The depicted embodiment includes the cable 20 with a pair of signal conductors 21 that can act as a differential pair. The signal conductors 21 are surrounded by an insulative layer 23 and then the insulative layer is covered by a shield layer 28 and then the shield layer is covered by an outer coating 26. It is expected that a drain wire will not be desired in most applications but can be included if desired and if included would be connected to the pedestal.

Figure 7:
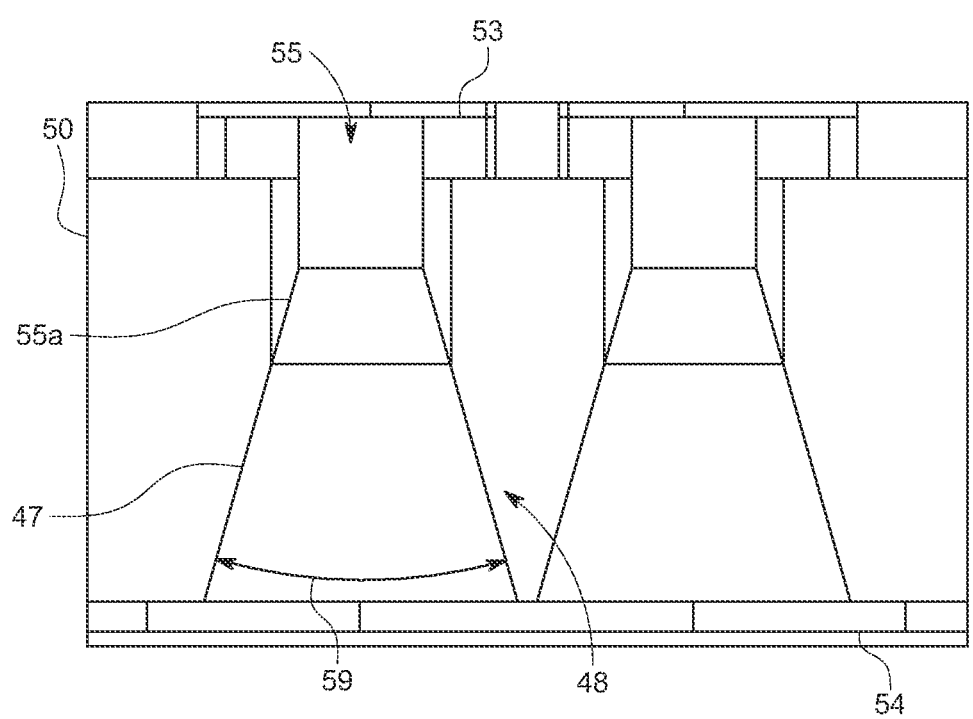
FIG. 7 illustrates an elevated side view of a cross-section of an embodiment of a board.

To connect the conductors 21 to signal pads 58 that are provided in a signal layer in the board 50, the conductors 21 can each be attached to a support via 53 by a weld 24 (or via a solder or other known attachment connection if desired) provided in the board 50. FIG. 7 shows a cross-section of an embodiment of a support via 53 configuration. The conductors 21 can each be inserted into an opening 43 in the board 50, which is aligned with an aperture 55 that may optionally include a taper 55a to help ease insertion of the conductor 21. Preferably the opening 43 will also include an inclined surface 47 that helps direct the conductor 21 into the desired position with respect to the support via 53 and then positioned so that an end of the conductor 21 is positioned adjacent a front side of the support via. A laser can then be used to weld or solder the conductor 21 to the support via 53. To connect the shield layer 28 of the cable 20 to the ground pads 56 on the connecting surface, a pedestal 30 is provided that connects the shield layer 28 to a ground plane 54 on the board 50.

If the conductors 21 are welded to the support vias 53 then the welds will be resistant to being detached upon exposure to elevated temperatures associated with soldering and the pedestal 30 can be attached to the board 50 and the shield layer 28 at a higher temperature (for example, with a higher temperature solder) after the conductors 21 are welded to the support vias 53 without worrying about losing the connection between the signal conductors 21 and the support vias 53. This in turn will allow for subsequent soldering of the board 50, once all the desired cables are attached, to other structures with the use of lower temperature solder, thus making the process of assembling a full system easier to manufacture. It should be noted that the use of solder to attach the pedestal 30 to the ground plane 54 is not required, however, and for certain applications the pedestal 30 can be attached with a conductive adhesive or can even be spot welded (potentially at multiple locations) with a laser.

As noted above, to ease installation of the conductors 21 into the board 50, the board 50 can be drilled with a tapered drill to obtain a structure such as is depicted in FIG. 7. If a taper is provided then a taper angle 59 can be a wide range of angles but typically will be from 15 degrees to about 40 degrees and the actual angle will depend, at least in part, on aperture spacing and board thickness. Preferably the taper angle 59 is sufficient to allow the natural spacing between the conductors to fit into the enlarged openings and then automatically align the two signal conductors in separate and adjacent apertures 55 so that upon further insertion into the apertures 55 the conductors 21 will be automatically be guided into position with respect to the corresponding support vias 53.

Figure 5:
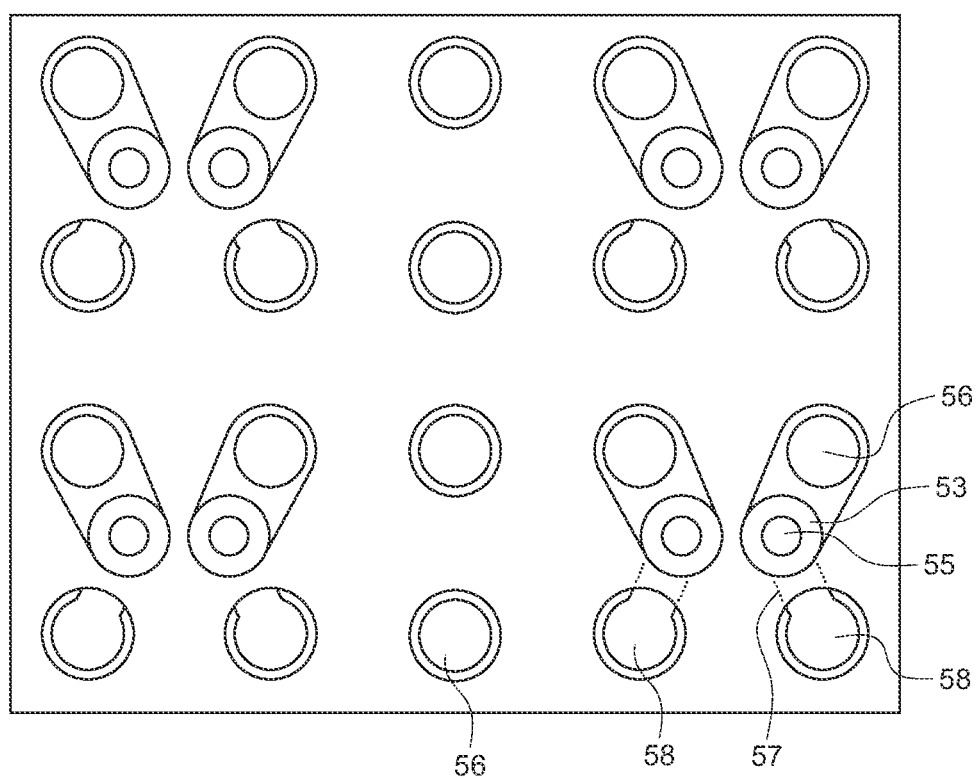
FIG. 5 illustrates a bottom plan view of an embodiment of a board.
Figure 6:
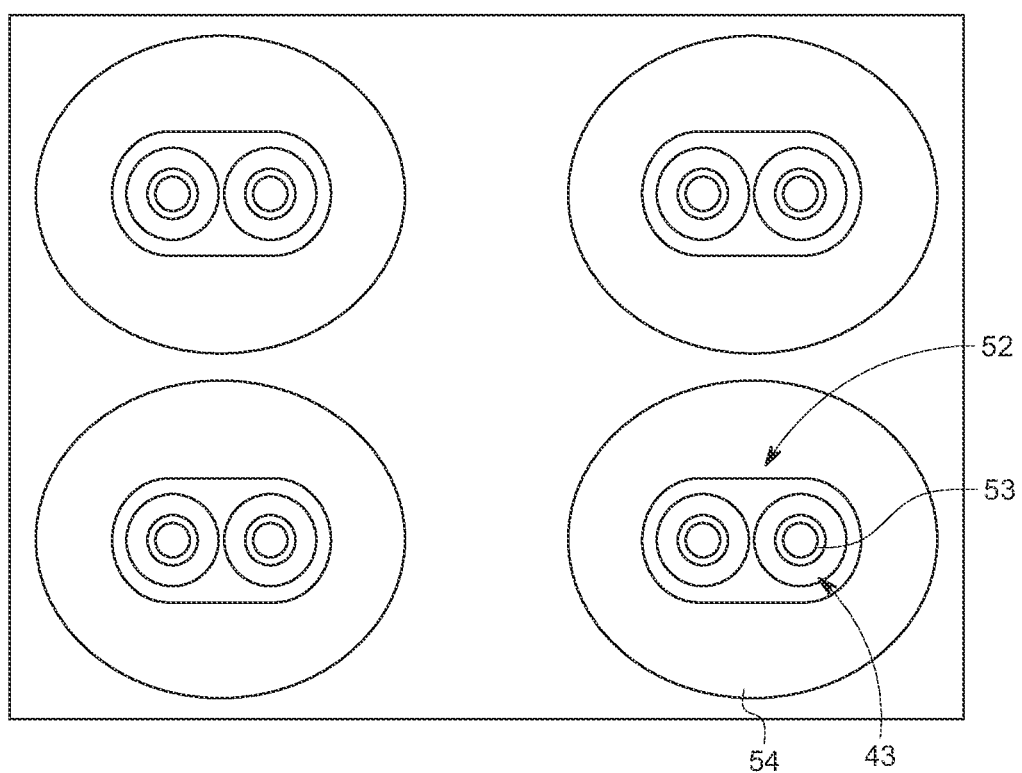
FIG. 6 illustrates a top plan view of the board depicted in FIG. 5.

To allow for improved attachment and appropriate ball grid array spacing, the support via can be connected by a short trace 57 to a signal pad 58, as is illustrated in FIG. 5. As can be appreciated, only a portion of the short trace 57 is visible due to the solder mask. A solder charge 61, which can be a solder ball, can be positioned on the ground and signal pads 56, 58 to allow for grid array attachment. It should be noted that the depicted design shows a uniform arrangement of solder balls but arrangements that are not uniform in spacing are also contemplated. One additional benefit of this construction is that attaching a solder charge 61 to a weld is less repeatable from a manufacturing standpoint and connecting the support vias 53 to signal pads 58 with the short trace 57 allows for a solder charge 61 to be positioned on conventional pads in a highly reliable fashion.

Figure 8:
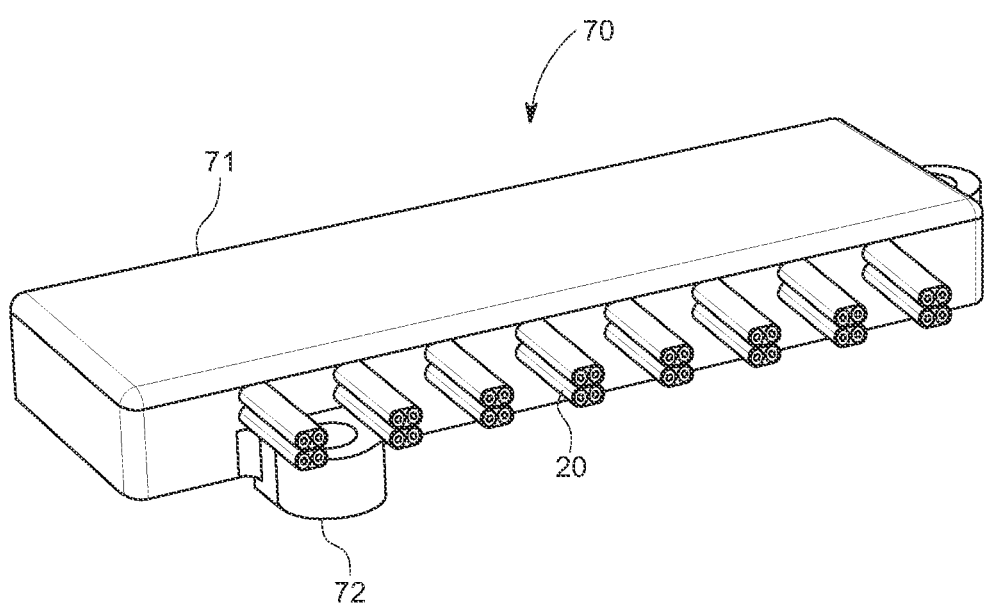
FIG. 8 illustrates a perspective view of an embodiment of a grid array connector system.

While the depicted weld 24 is reasonably strong, it is often going to be desirable to have some sort of strain relief for the cables. In one embodiment, a portion of the wires and the board can be encapsulated in an insulative material (potentially by using a low-pressure molding process) to provide a housing 71. The housing 71 can include attachment features 72, such as is shown in FIG. 8 to form a grid array connector system 70. The grid array connector system 70 can include the board 50, with a connection surface 51b that includes a plurality of solder charges 61 that form a connection pattern 62. As can be appreciated, the internal design of the grid array connector system can be arranged as shown in FIGS. 1-7.

Figure 9:
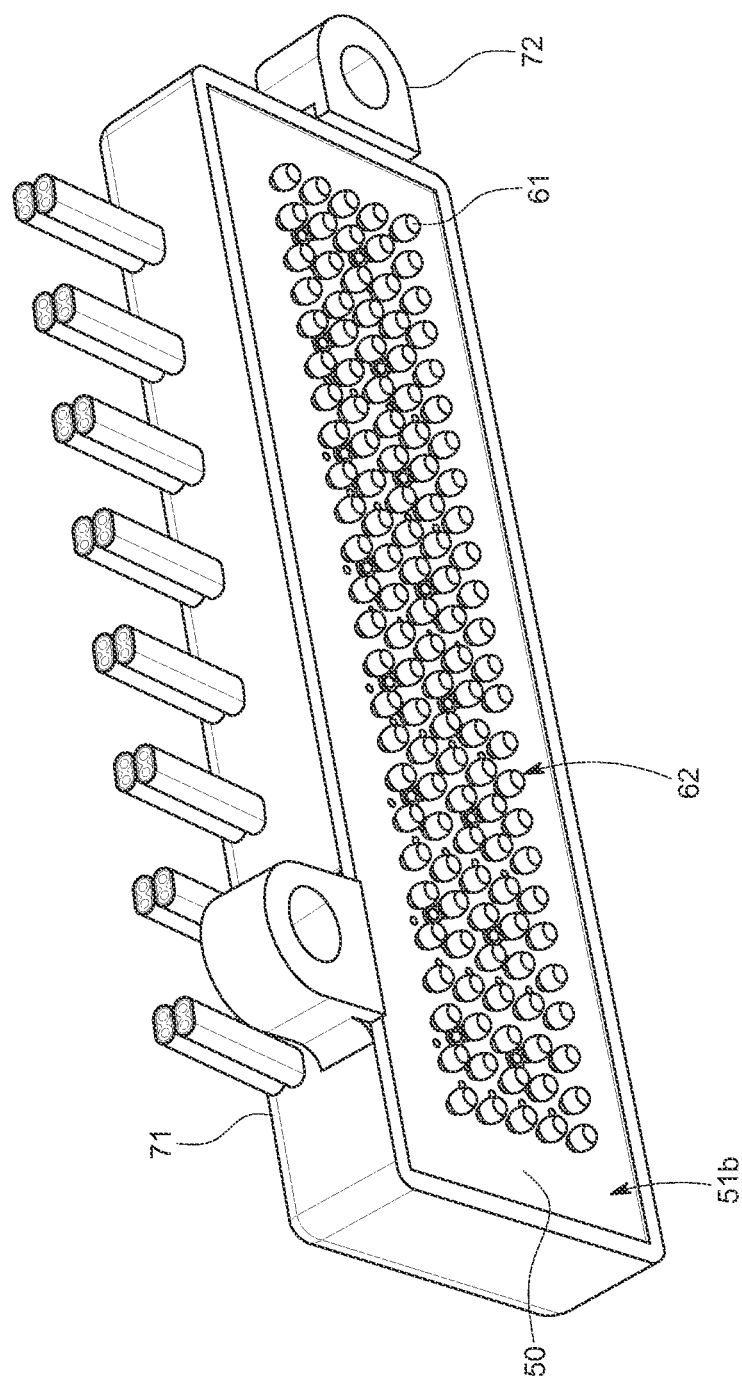
FIG. 9 illustrates another perspective view of the embodiment depicted in FIG. 8.

As can be appreciated from FIG. 9, a relatively large connection pattern can be formed to allow for a larger number of connections in a compact and low profile configuration, thus allows the grid array connector system to be positioned closely to a corresponding ASIC. While such a construction is useful to connect large numbers of differential pairs together, the resultant size can cause problems when attempting to solder attach the connection pattern to another surface because the size can act as an impediment to sufficient thermal energy reaching the interior solder charges. To prevent uneven thermal energy distribution (and the resultant problems with connectivity) from happening, one or more thermal channels (which can be grooves or apertures) can be provided in the board and/or housing to allow for improved and more even thermal transfer to all the solder charges. The thermal channel can be from the side or extend through the housing 71 and the board 50 inside the connection pattern 62 (thus creating a break in the connection pattern 62). The decision to include thermal channels to improve thermal performance of the solder attach will be based on the size of the pattern connection and numerous other parameters such as cycle times and materials and is thus left to the person of ordinary skill in the art to determine as desired.

Figure 10:
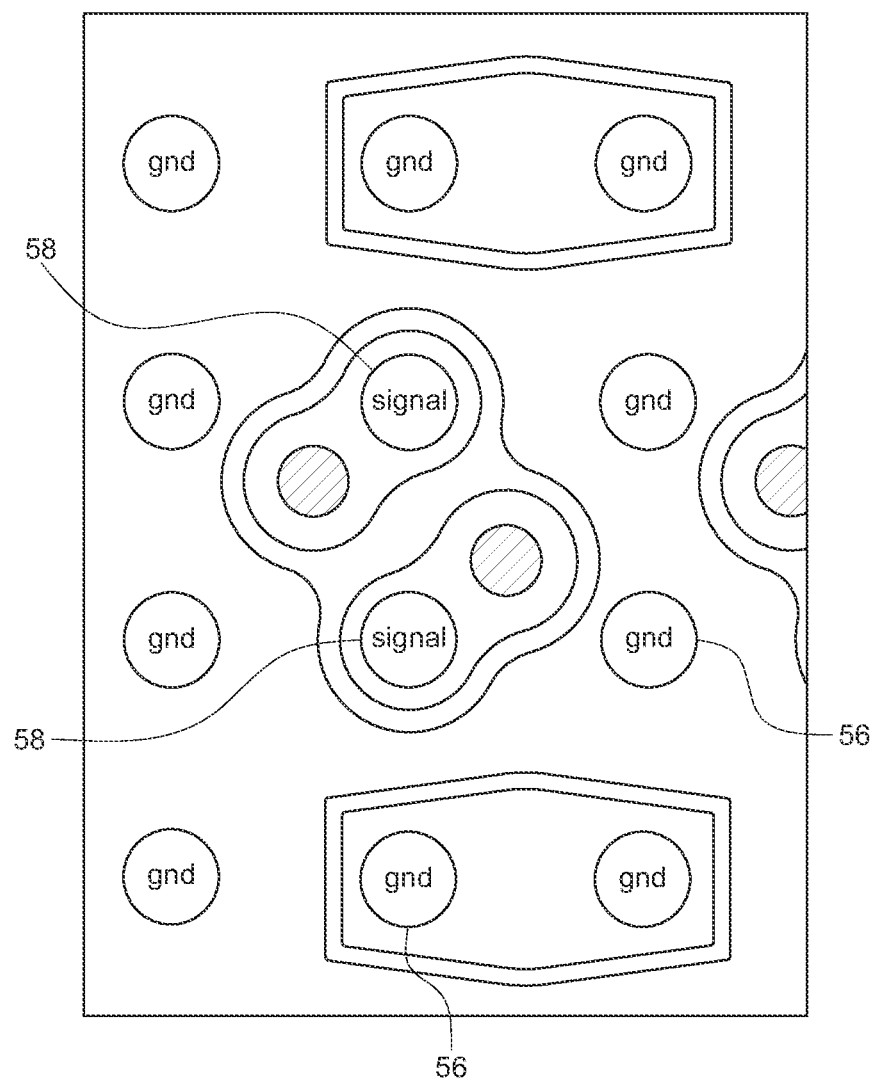
FIG. 10 illustrates a partial bottom plan view of an embodiment of a board.
Figure 11:
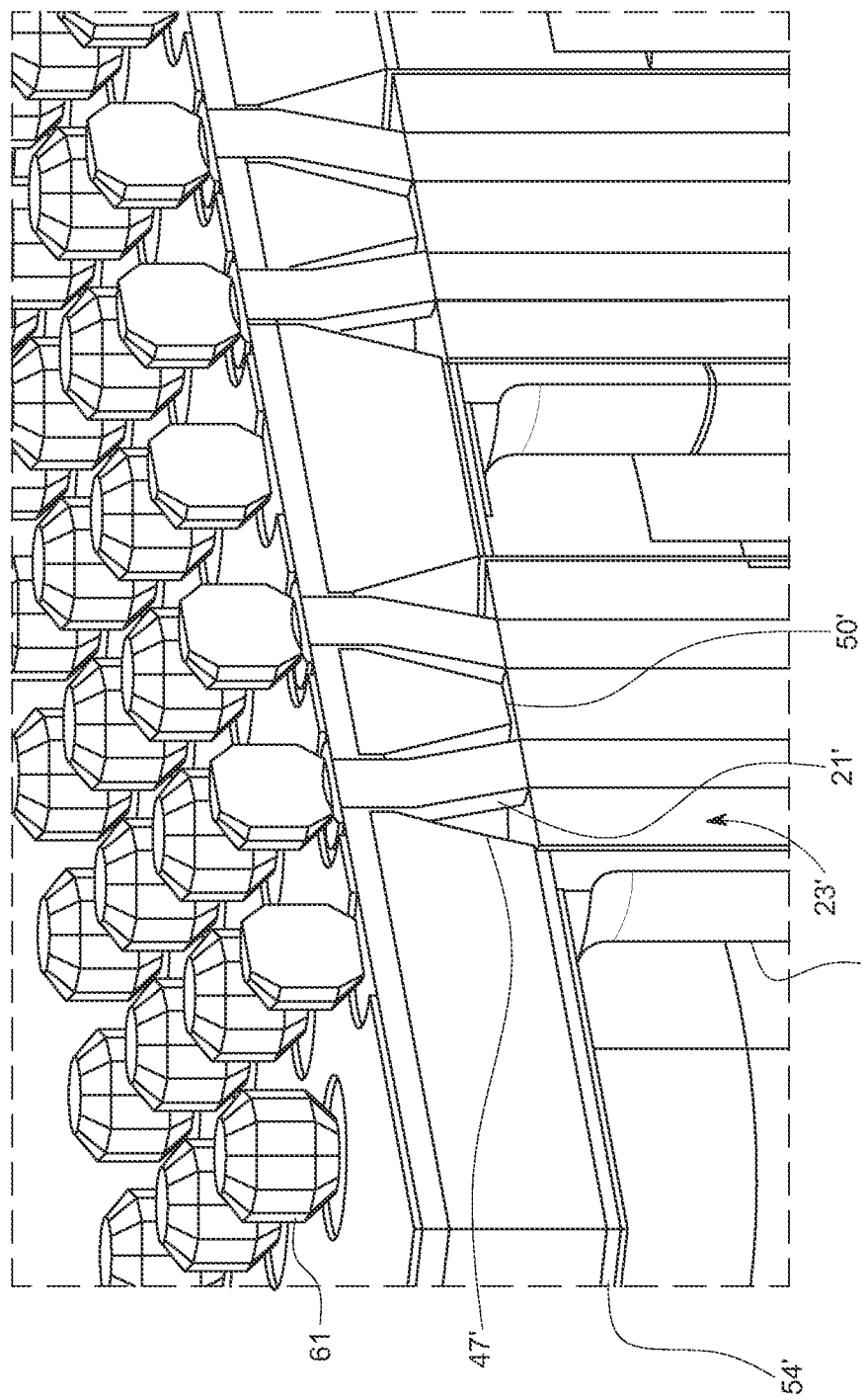
FIG. 11 illustrates a perspective view of partial cross-section of a grid array connector system.

As noted above, as shown in FIG. 5, in certain embodiment the solder charges 61 are attached to signal pads 58 that are spaced apart from the support vias 53. As noted, this has the advantage of avoiding soldering to a welded surface that is potentially inconsistent and that may be difficult to get a solder ball to attach to reliably prior to reflow. As can be appreciated, such a configuration allows for useful use of isolation, by surround signal pads 58 with ground pads 56, such as shown in FIG. 10. The disadvantage of such a construction is that a short trace 57 is needed to connect the support via 53 to the signal pad 58 and the short trace can affect signal integrity. FIG. 11 illustrates another embodiment that has a construction that allows for via-direct attachment of solder balls. As depicted, the conductors 21' are supported by an insulative layer 23' that is positioned in a pedestal 30' that is attached to the ground plane 54'. The conductors 21' extend through a tapered via 47' and are positioned further part and are welded to the corresponding pads. Solder charges 61 are then positioned on all the pads in a conventional manner. For larger gauge conductors such a construction may be easier to work with as the spacing between the conductors will be more consistent with the desired spacing of the ball grid array. As is known, however, it can be challenging to get solder balls to consistently solder to a welded surface, especially if the welded surface is not perfectly uniform. One possible approach to this is to have the support via extend into the board a little further and weld the conductors to the support via below the top surface so that point where the solder charge is positioned in not part of the weld itself. Such a construction can allow for good electrical performance while providing a more consistent surface for placement of solder balls as the resultant contact area of the support via can provide a circular rim-shaped surface or can even be somewhat concave.

Figure 12:
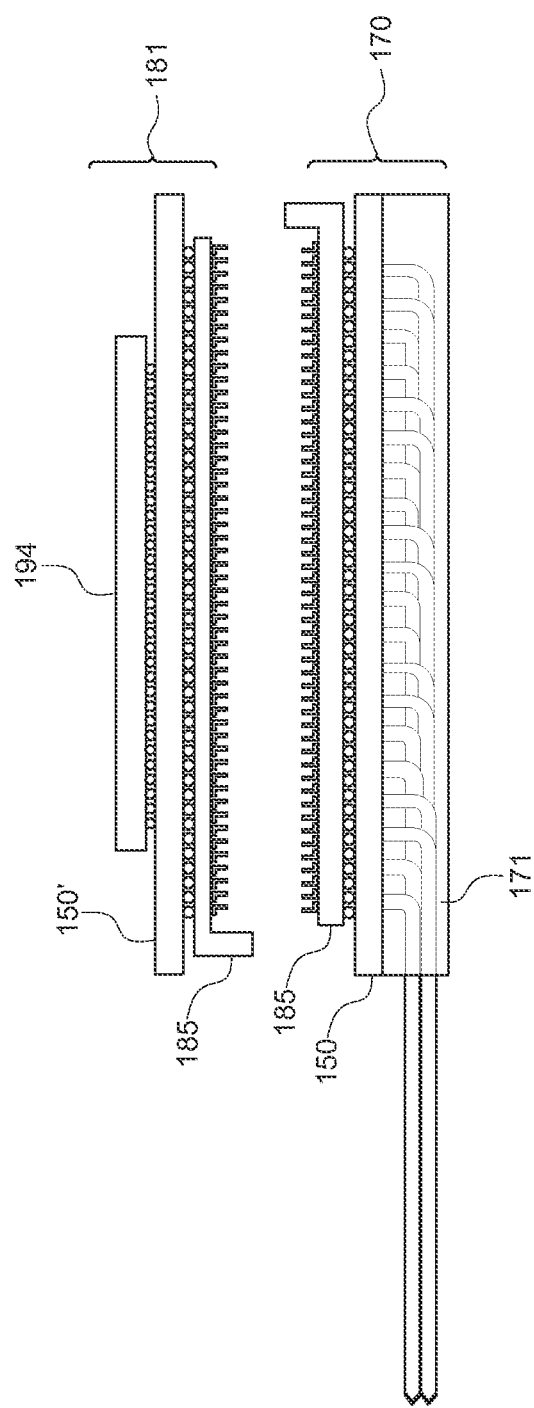
FIG. 12 illustrates an elevated side view of a grid array connector system configured to mate with chip package connected to a connector positioned below the chip package.
Figure 13:
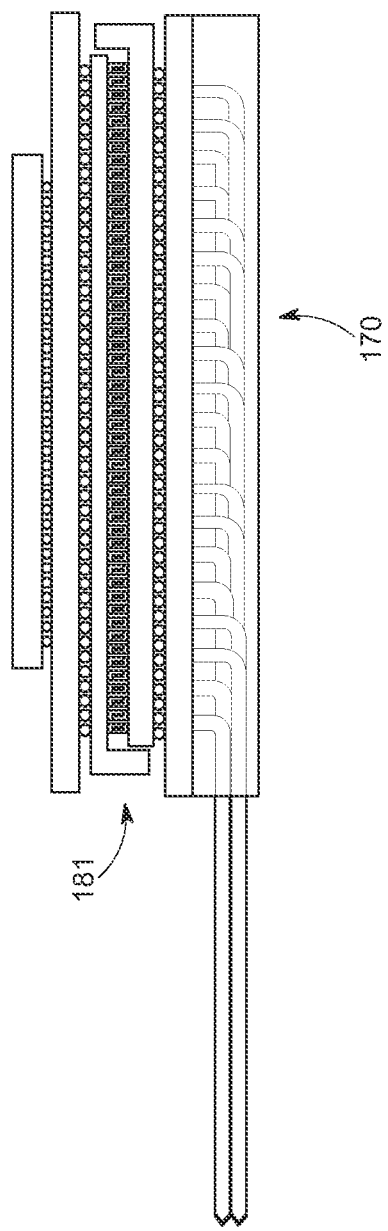
FIG. 13 illustrates an elevated side of the embodiment depicted in FIG. 12 with the connectors in a mated condition.

As can be appreciated from FIGS. 12-13, one potential application of the embodiments depicted in FIG. 1-11 is to include a mezzanine connector 185 in a grid array connector system 170. As is known, mezzanine connectors can be made to function in a compact space, can be hermaphroditic, and can have excellent electrical performance due to the ability to provide a relatively linear configuration. The depicted embodiment includes the mezzanine connector 185, therefore, allows for a reversible connection between the grid array connector assembly 170 and a package 194 that is mounted on a board 150' (which can be any desirable type of board, as discussed above) which is mounted on another mezzanine connector 185. Such a configuration can provide excellent electrical performance while also providing low insertion force to mate the chip package to the grid array connector assembly 170. As can be appreciated, one advantage of the design is that it allows for the chip package 194 to be attached to a connector separate from the attachment of the board 150' to a difference mating connector. This allows both elements to be processed separately and can help reduce scrap and/or rework. Naturally, the depicted design also allows the original chip package (which can consist of an integrated circuit of a desired design and any other typical structures provided in a chip package) to be readily replaced with a higher performing chip package if desired.

Figure 14:
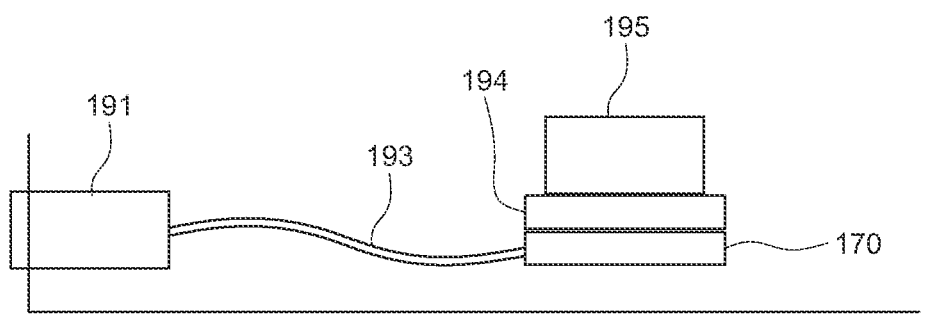
FIG. 14 illustrates a schematic representation of an embodiment of grid array connector system positioned in a system.

FIG. 14 illustrates a simplified schematic representation of another potential construction. A first connector 191 is positioned adjacent a box mounting face and is connected via a cable set 193 (which includes a plurality of cables) to a grid array connector system 170. A chip package 194 is mounted directly to the grid array connector system and a heat sink 195 is provided on the chip package. As can be appreciated, such a system allows for additional flexibility in the system, particularly if the connector 191 is removable mounted (thus allowing for complete upgrades if desired).

Figure 16:
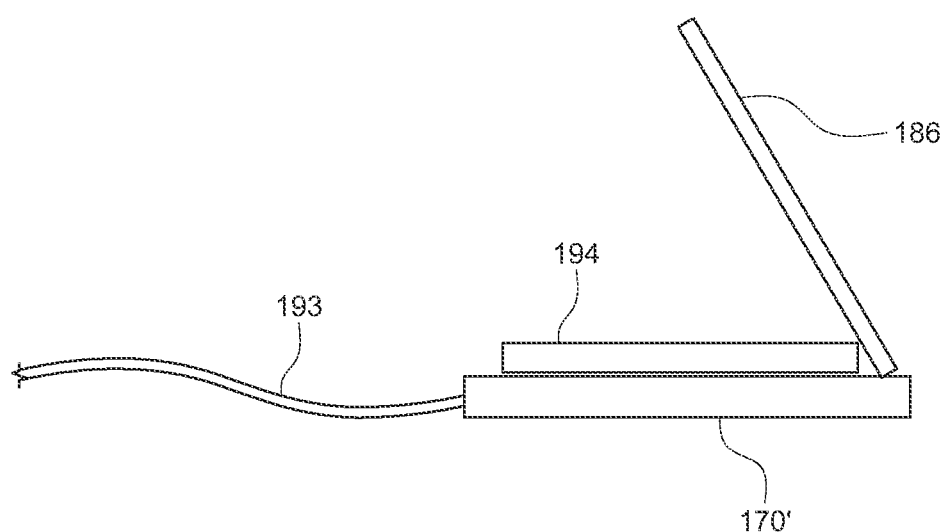
FIG. 16 illustrates a schematic representation of an embodiment of a grid array connector system configured to include a chip socket.
Figure 17:
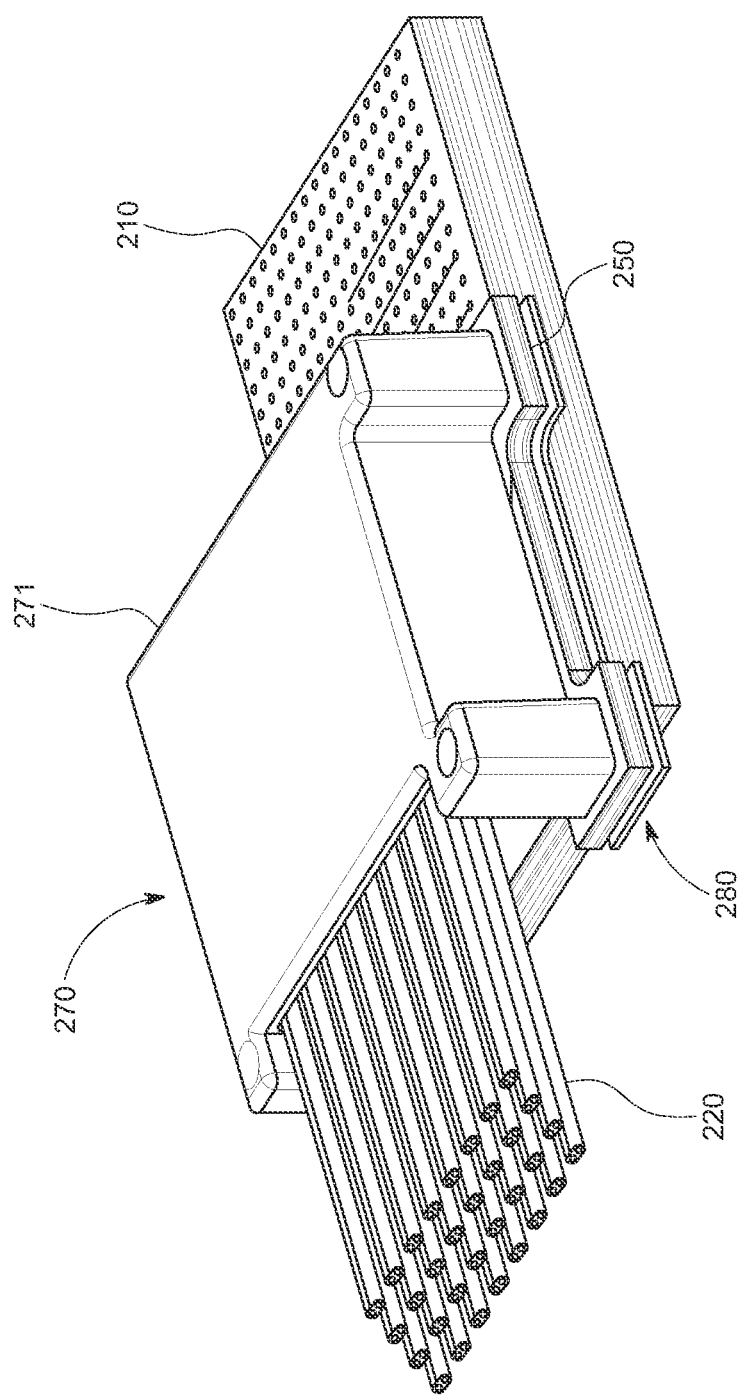
FIG. 17 illustrates a perspective view of another embodiment of a grid array connector system mounted on a circuit board.
Figure 18:
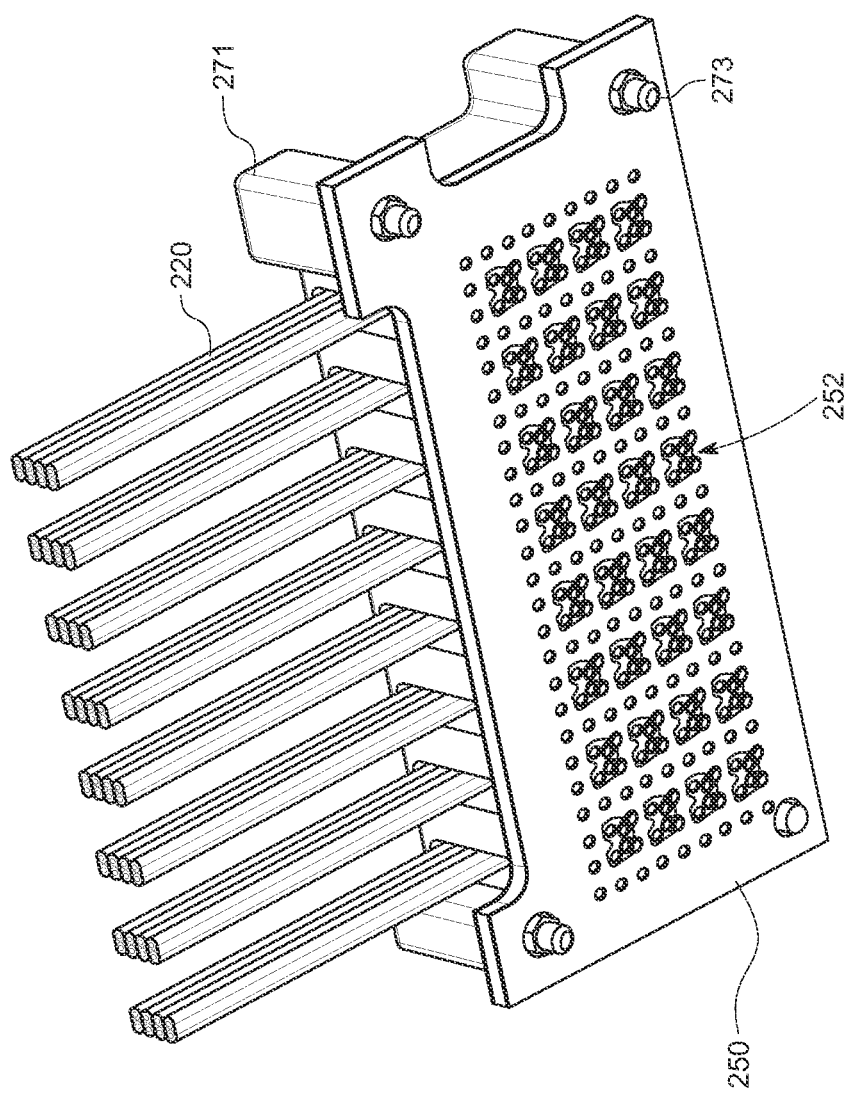
FIG. 18 illustrates a perspective simplified view of the grid array connector depicted in FIG. 17.
Figure 19:
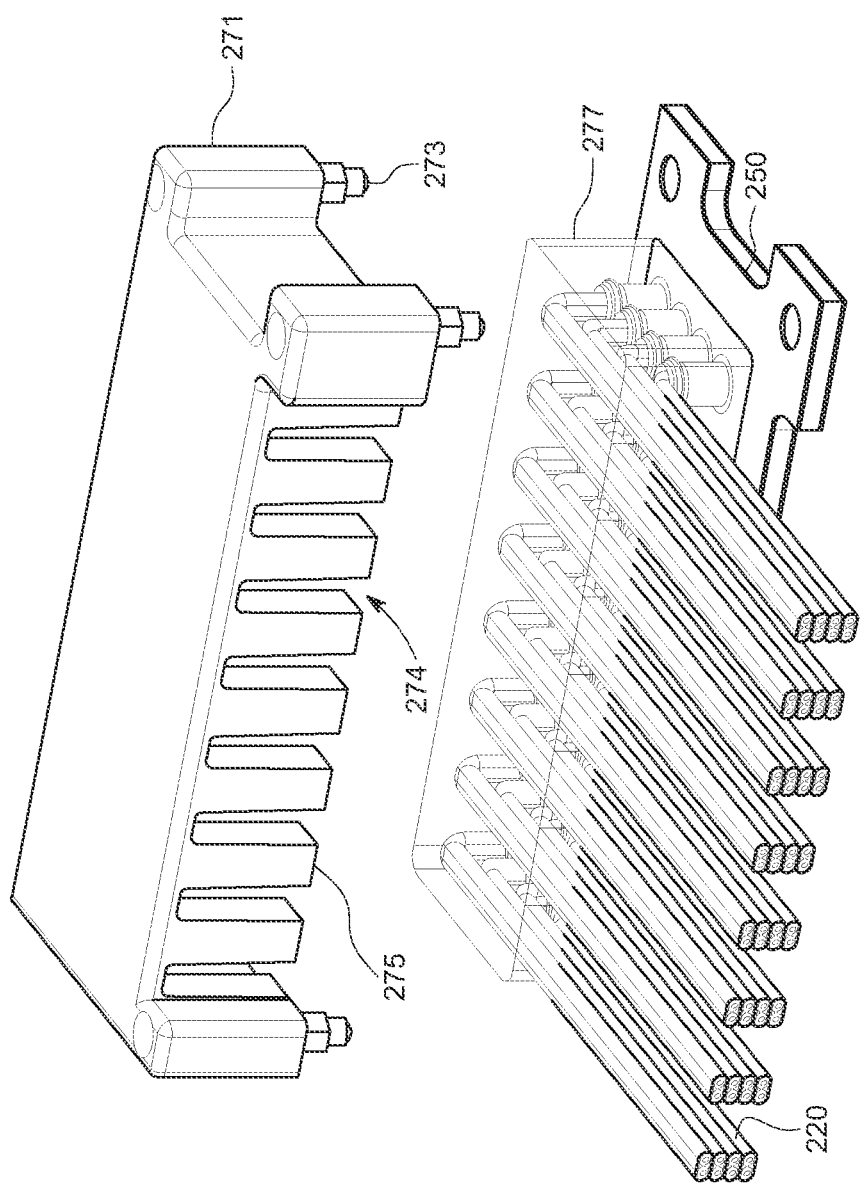
FIG. 19 illustrates a perspective partially exploded view of embodiment depicted in FIG. 18.

It should be noted that in certain embodiments the grid array connector system that the board is connected to could also be provided as a socket design with a plurality of contacts that are configured to directly attach to pads on the ASIC package. Such a grid array connector system could include, for example, an interposer that had deflectable contacts and the housing would be formed into a socket type shape (which is slightly more complicated) but would allow for the elimination of a second connector and thus may be desirable. As shown schematically in FIG. 16, the grid array connector system 170' is configured to include a socket assembly would directly receive a chip package and would include a clamping member 186 (which can be integrated or provided separately) to hold the chip package 194 in place. While a rotating clamping member 186 is illustrated and is fairly common in conjunction with known chip packages, the clamping member is not so limited and instead a wide range of clamping structures are possible. In certain embodiments, for example, the clamping member might be integrated into a heat sink and could be attached with separate fasteners. While conventional socket designs are less ideally suited to high signaling frequencies and corresponding high data rates, in part because of the terminal designs and the uniform spacing, the depicted embodiment can overcome those limitations with a more customized and less uniform grid array along with the ability to connect wires very cleanly (electrically speaking) to the contacts in the grid array connector system that engage the chip package.

Figure 15:
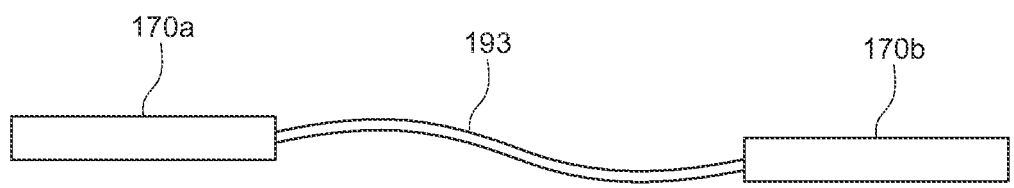
FIG. 15 illustrates a schematic representation of two grid array connector systems being connected by a cable set.

As can be appreciated from FIG. 15, the use of the grid array connector systems disclosed herein is not limited to particular applications such as a bypass style application. The technology would work well as a jumper between two chip packages and allows for substantially greater flexibility in the location of the chip package. For example, one or more of the grid array connector systems 170a, 170b could be positioned adjacent a liquid-cooled block positioned adjacent a rear of the device (which could reduce the need for air flow through the chassis of the server). Furthermore, while two grid array connector systems 170a, 170b are shown connected together by a cable set 193, in an embodiment three or more grid array connector systems (and the corresponding chip packages) could be connected together by a cable set to help provide for improved high performance computing (HPC) performance.

Turning to FIGS. 17-27C, another embodiment of a grid array connector system 270 is depicted. The grid array connector system 270 includes a housing 271 that is positioned on a board 250 and a plurality of cables 220 are terminated to a board 250. In an embodiment the cables are provided in rows of four, which provides desirable compactness and density, but other configurations are suitable depending on the application. Similarly to board 50 discussed above, the board 250 includes a mounting surface 251a and a connecting surface 251b and connecting passages 252 extend therebetween. Board 250 can further include ground planes 259a, 259b internally to help provide improved electrical performance. The connecting passages 252 include two openings 243 that are each aligned with an aperture 255 in a support via 253. The board 250 provides a grid of signal pads 256 and ground pads 258 on the connecting surface that can be connected to a chip substrate or interposer, such as interposer 280 or directly on circuit board 210.

The plurality of cables 220 are terminated to the board 250 by the use of a first pedestal 240a and a second pedestal 240b and once terminated the board and pedestals can be retained by a retaining mold 277 that can be a low-pressure mold or a potting compound. As can be appreciated, the housing 271 includes fingers 275 that form channels for the cables to extend through and includes alignment pegs 273 that can be used to align the housing with a mating component.

Figure 20:
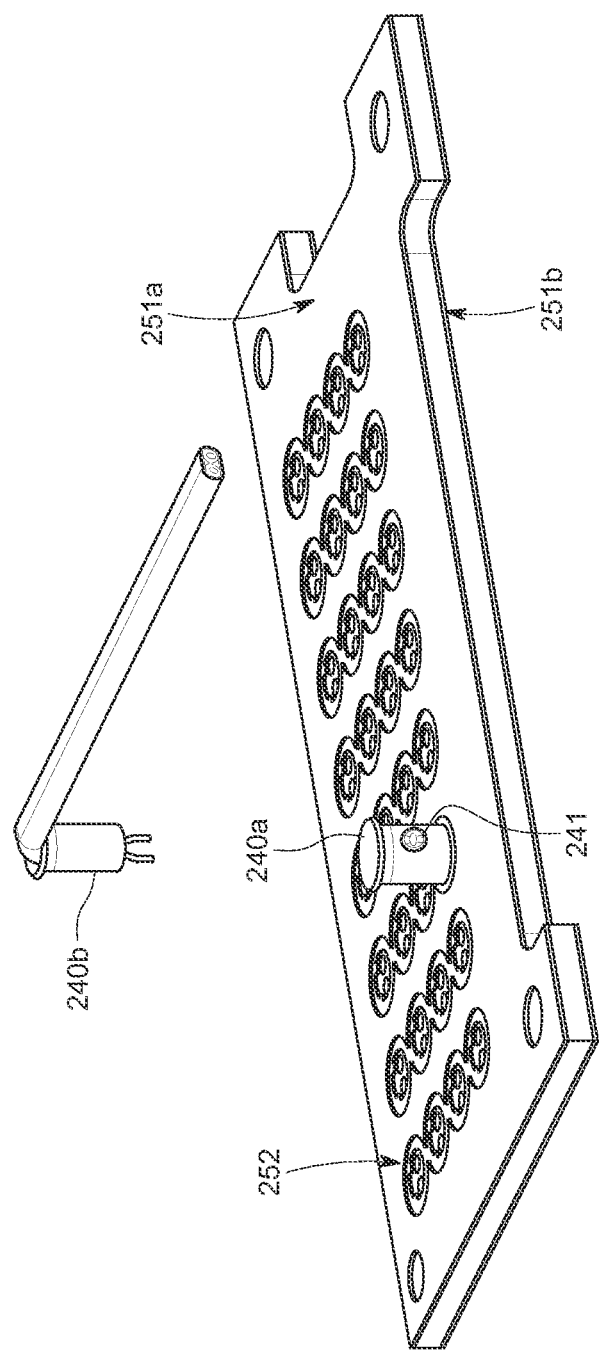
FIG. 20 illustrates a perspective view of an embodiment of an internal design of a grid array connector system that could be used in the embodiment depicted in FIG. 18.
Figure 21:
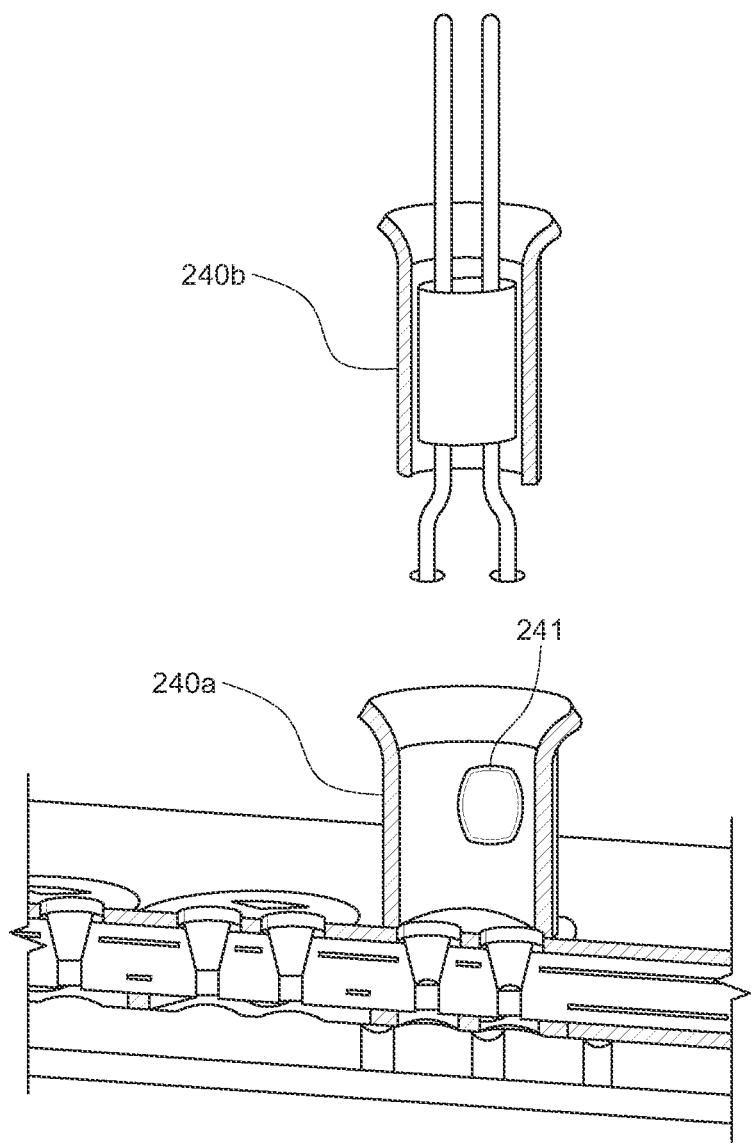
FIG. 21 illustrates a perspective, partially cut away partial view of an embodiment of an internal design of a grid array connector system.
Figure 22:
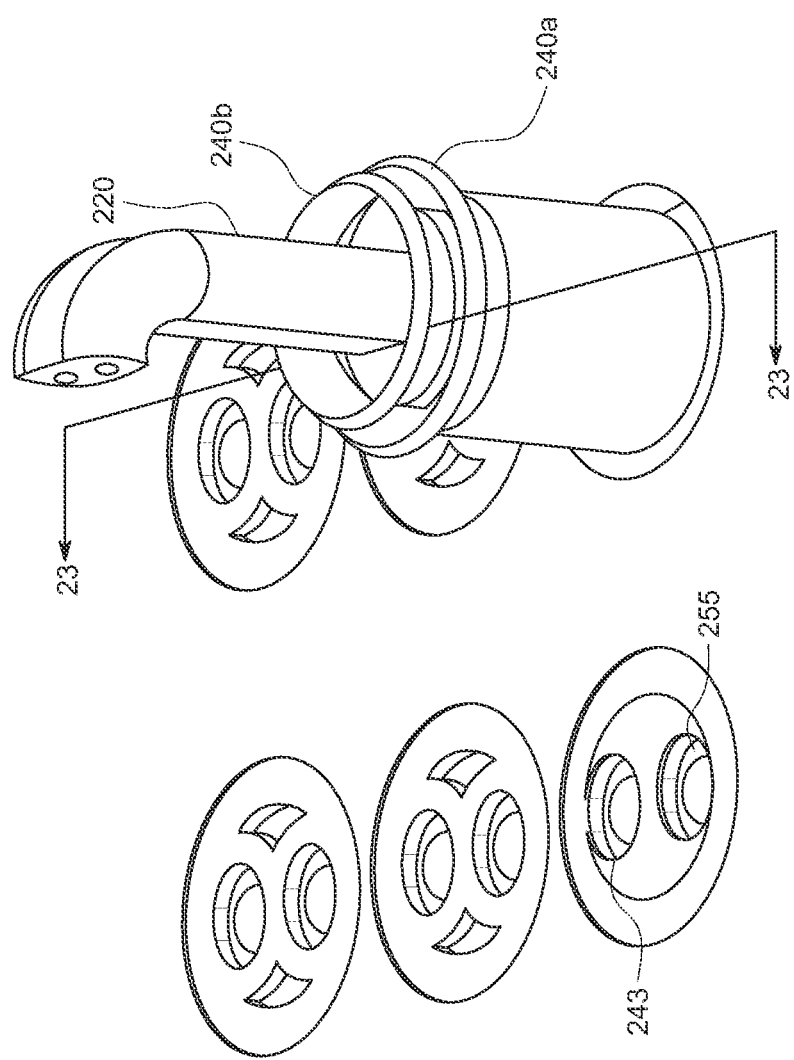
FIG. 22 illustrates a perspective view of an embodiment of an internal design of a grid array connector system that could be used in the embodiment depicted in FIG. 18.
Figure 23:
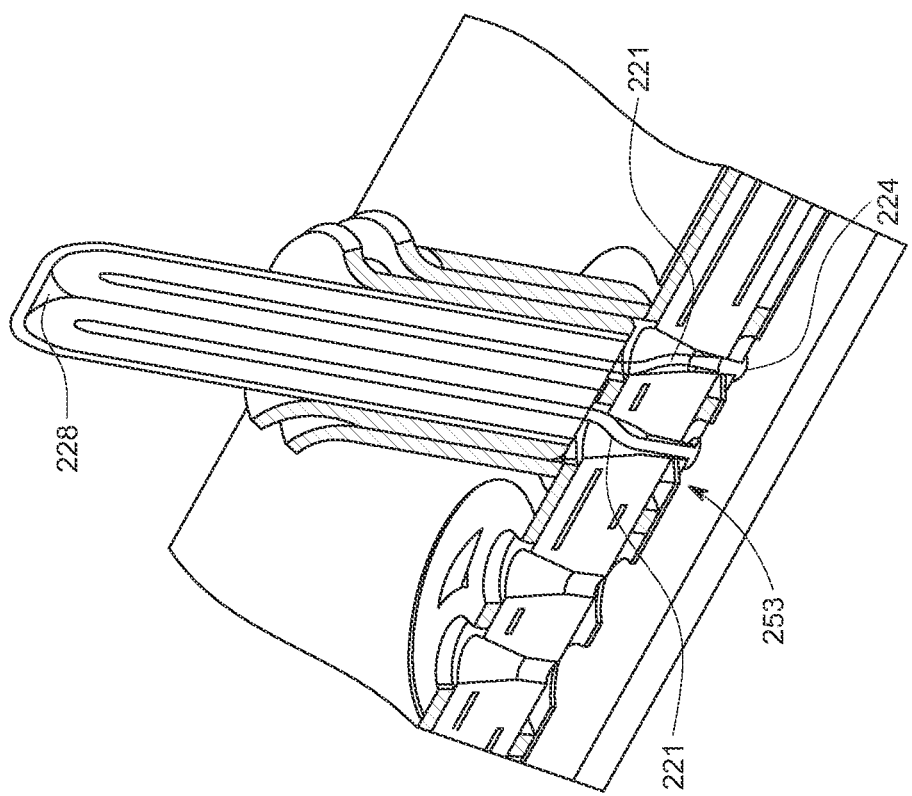
FIG. 23 illustrates a perspective view of a cross section of FIG. 22 taken along line—23-23.
Figure 24:
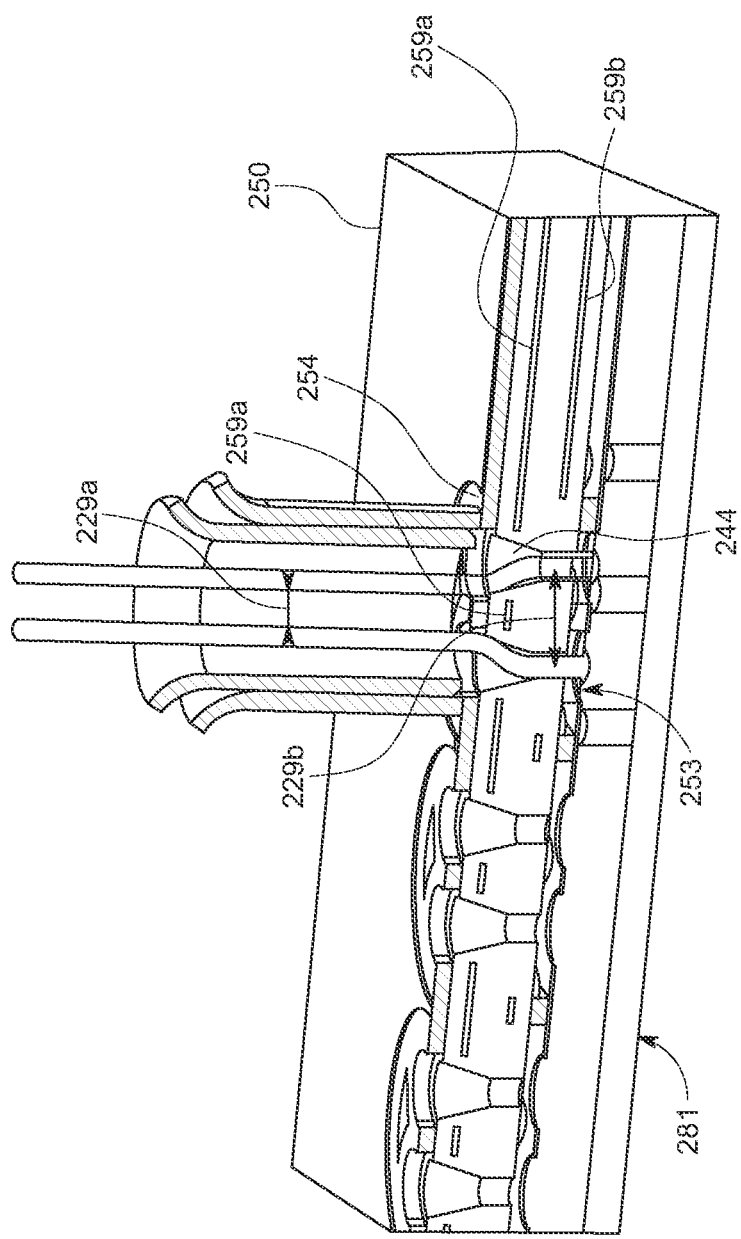
FIG. 24 illustrates a perspective simplified view of embodiment depicted in FIG. 23.
Figure 25:
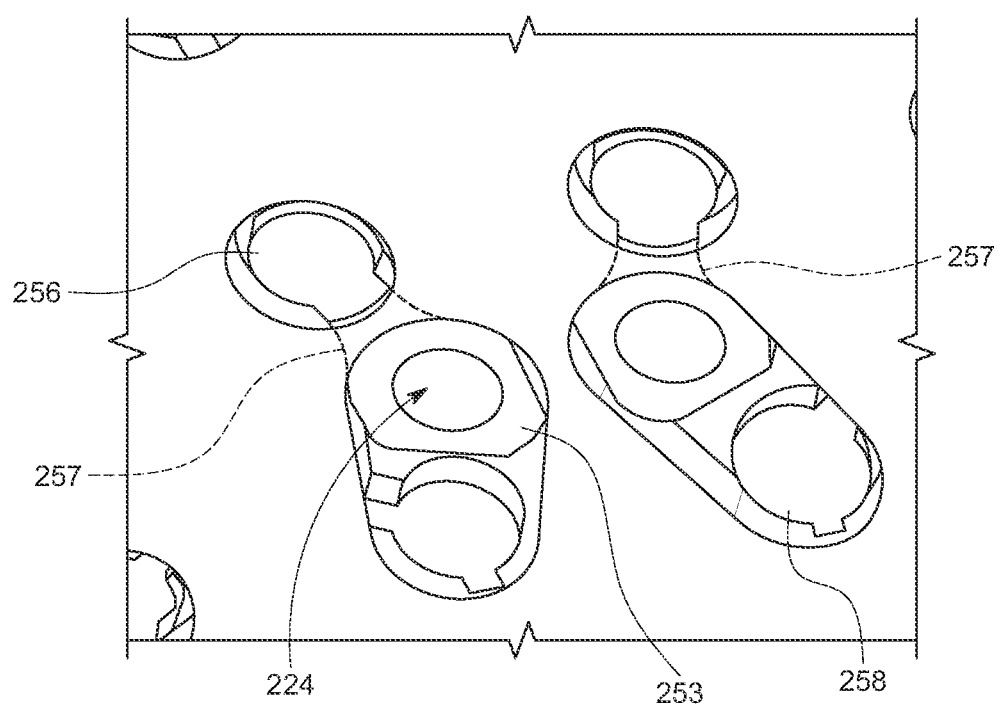
FIG. 25 illustrates a perspective view of an embodiment of a board.

The first pedestal 240a can be mounted on the board 250 in a manner similar to how pedestal 30 was attached to the board 50 and the cables 220 are first connected to the second pedestal 240b and in an embodiment a shield layer 228 of each of the cables 220 is electrically connected to the corresponding second pedestal 240b (via solder or welding or conductive adhesive). The second pedestal 240b is mated to the first pedestal 240a and the first and second pedestals 204a, 240b can be retained together with an adhesive, a weld or an interference fit, such as a depression 241 in the first pedestal 240a that presses against the second pedestal 240b, which is shown in FIGS. 20-21. In other words, an interference fit may be suitable to retain the first and second pedestals 240a, 240b together.

As was discussed above with respect to board 50, board 250 includes openings 243 that can have an inclined surface 247 that can be used to direct conductors 221 in the cable 220 to the desired position. This may cause the conductors 221 to go from a first spacing 229a to a second spacing 229b that is different than the first spacing. In an embodiment the second spacing 229b is at least 50 percent greater than the first spacing 229a to provide an improved pad arrangement on the connecting surface 251b. The modified spacing is optional but has been determined to be beneficial for cables with small sized conductors. The conductors 221 are mounted to the support via 253 (preferably with weld 224 but as discussed above, other attachment methods may also be used). The support via 253 can be electrically connected to signal pad 256 (if such signal pads are separate from the support via 253) in the connecting surface via short trace 257 in the board 250.

Figure 26:
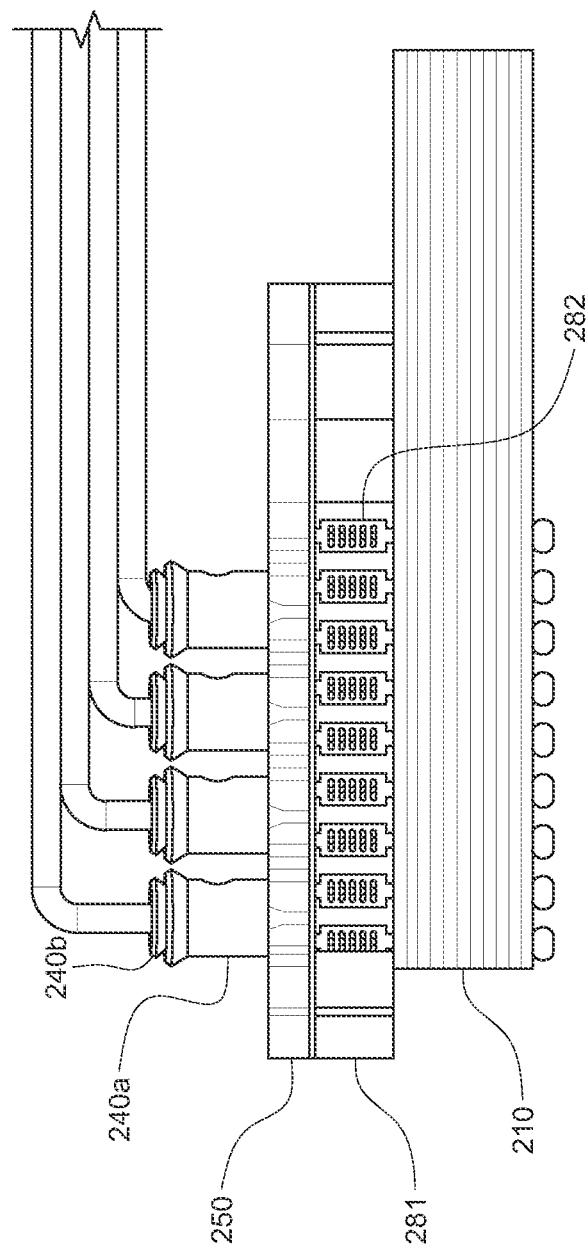
FIG. 26 illustrates an elevated side view of an embodiment of a grid array connection system mounted on a circuit board where the grid array connector system includes an interposer.
Figure 27A:
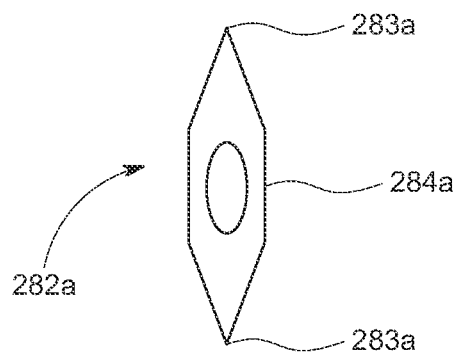
FIG. 27A illustrates an embodiment of a contact suitable for use in an interposer.
Figure 27B:
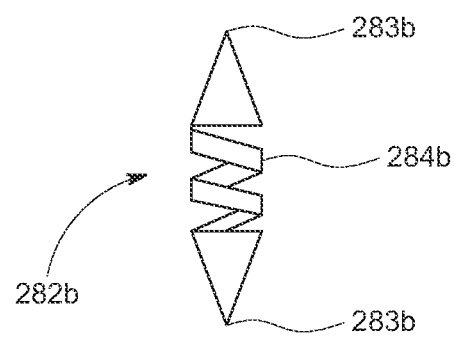
FIG. 27B illustrates another embodiment of a contact suitable for use in an interposer.
Figure 27C:
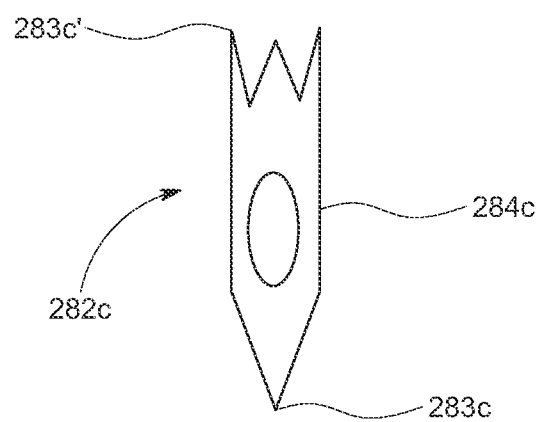
FIG. 27C illustrates another embodiment of a contact suitable for use in an interposer.

As previously discussed, the pads 256, 258 on the board 250 can be directly connected to pads on another surface, such as circuit board 210 with solder. As shown in FIG. 26, however, a different option is possible. Instead of soldering the board 250 to the circuit board 210, an interposer member 280 can be used to connect pads on the board 250 to pads on the circuit board 210. The interposer 280 includes a frame 281 that supports contacts 282 that can engage pads on two sides of the interposer. Contacts 282a, 282b and 282c are shown on FIGS. 27A-27C and can be supported by the frame 281. Contact 282a includes ends 283a and a middle 284a that is not configured to flex in a substantial manner. Contact 282b includes ends 283b and a middle 284b that is configured to flex. Contact 282c includes end 283c and end 283c' with a middle 284c that is not intended to flex in a substantial manner. As can be appreciated, the contacts can have multiple points of contact on one or both ends and can be compressible or non-compressible as desired, depending on the application. In addition, because there can be multiple ground connections it may be desirable for the ground contacts to be configured differently than the signal contacts (e.g., with different impedance) to help tune the impedance of the common mode and differential mode appropriately. Accordingly, signal contacts can be configured differently than ground contacts.

Figure 28:
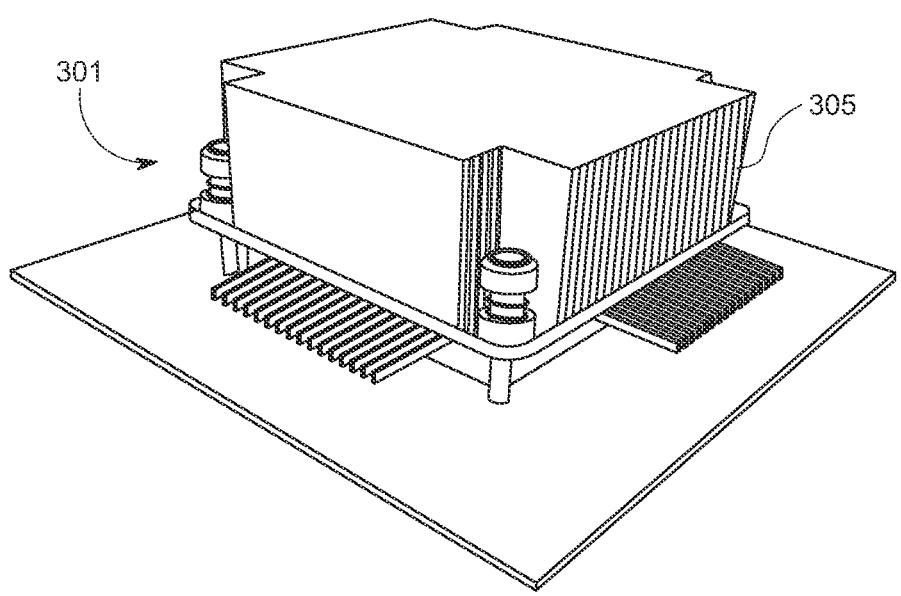
FIG. 28 illustrates a perspective view of another embodiment of a grid array connector system that can be used with a heat sink.
Figure 29:
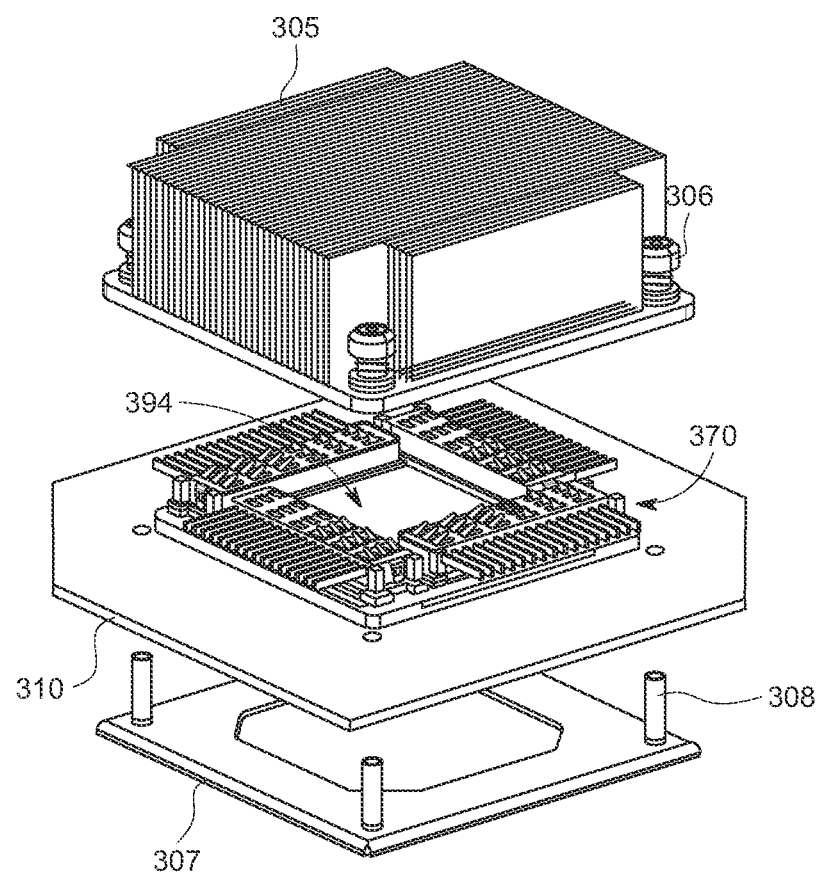
FIG. 29 illustrates a perspective partially exploded view of embodiment depicted in FIG. 28.
Figure 30:
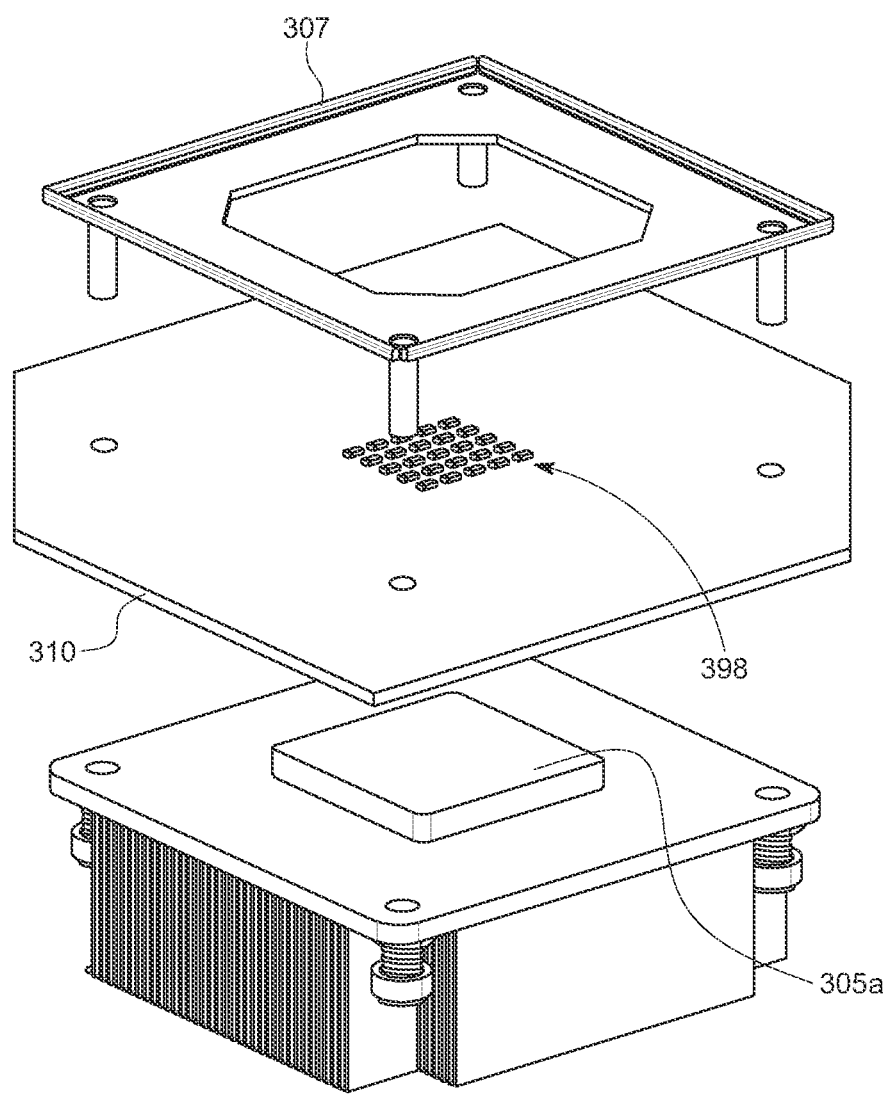
FIG. 30 illustrates another perspective view of the embodiment depicted in FIG. 29.
Figure 31:
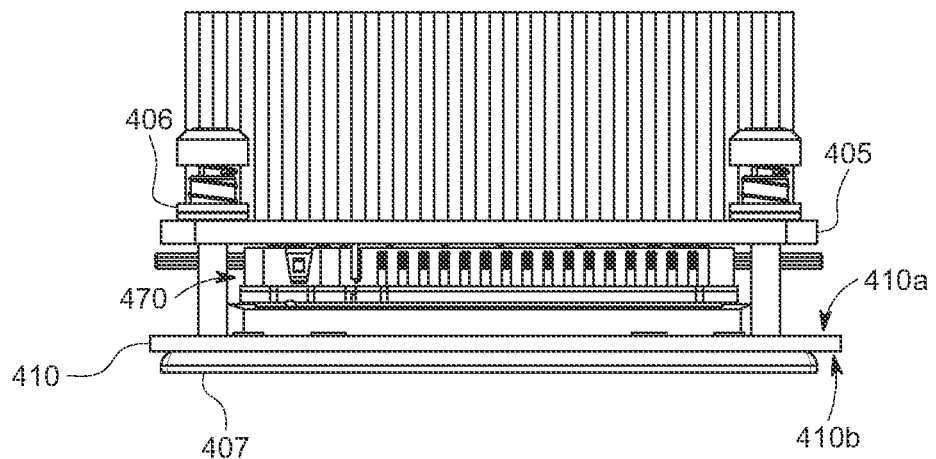
FIG. 31 illustrates an elevated side view of an embodiment of a grid array connector system that can be used with a heat sink.
Figure 32:
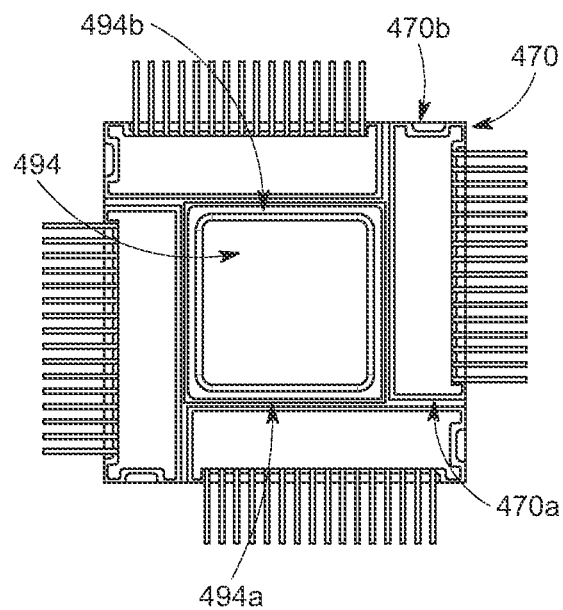
FIG. 32 illustrates a simplified plan view of an embodiment of a chip package and a plurality of grid array connector systems.

FIGS. 28-30 illustrate an embodiment of compute system 301 that includes a heat sink 305. As depicted, a grid array connector system 370 is mounted on multiple sides of a chip package 394. As depicted the grid array connector system 370 is positioned on four sides of the chip package 394 (both of which are positioned on a circuit board 310) but the grid array connector system 370 could also be mounted on a lesser number of sides. A retaining frame 307 with retaining legs 308 can be provided to help secure the heat sink 305 with attachment member 306 into the desired position and the heat sink 305 includes a projection 305a that designed to press against the chip package 394 so as to ensure there is good thermal connection between the heat sink 305 and the chip package 394. To ensure there is a sufficiently efficient thermal connection between the heat sink and chip package one can include some sort of thermal interface material (TIM), which could be a paste or other suitable material. If greater thermal efficiency is required them then chip package could be directly soldered to the heat sink. As can be appreciated, the circuit board 310 can include a connection area 398 aligned with the chip package to provide for additional signal paths to other components (or to mount components directly under the chip package). As can be appreciated, the heat sink 305 presses against both the chip package 394 and the grid array connector system 370 and thus helps ensure both are firmly pressed into place and a reliable connection is maintained.

FIGS. 31-36 illustrate another embodiment similar to the embodiment depicted in FIGS. 28-30. A heat sink 405 with an attachment member 406 is connected to retaining frame 407 that is positioned on a bottom side 410b of a circuit board 410. Between the circuit board 410 and the heat sink 405 (on a top side 410a of the circuit board 410) a chip package 494 and a plurality of grid array connector systems 470 are positioned. As can be appreciated from FIG. 32, each of the grid array connector systems 470 are positioned so that a first end 470a is aligned with a first edge 494a of the chip package 494 and a second end 470b extends out past a second edge 494b of the chip package 494 so as to improve the connection density. Naturally if such density is not needed then other configurations would also be suitable.

The grid array connector system 470, similar to embodiments discussed above, includes cables 420 that are supported by a housing 471 and connected to a board 450 and the board 450 is connected to an interposer 480 with a frame 481 that supports contacts. The circuit board 410 includes alignment apertures 458 that are configured to mate with alignment pegs 473. Naturally the alignment apertures can be in the same pattern on each side of the chip package to allow for commonality or can be different to ensure only certain grid array connector systems can be positioned on certain sides. As can be appreciated, it is desirable for the interface between chip package 494 and heat sink 405 to define the vertical position of the heat sink as the thermal connection between the chip package 494 and heat sink 405 influences the amount of heat that can be removed from the chip package 494. The depicted system includes a compression member 464 that ensures the heat sink 405 presses on the grid array connector system 470 with the desired force (and thus can tolerate variations in the vertical position of the heat sink 405 relative to the circuit board 410. The depicted compression member 464 includes a base 465 with compression fingers 466 and includes a latch arm 467 that engages a latch catch 471*a* to secure the compression member 464 to the housing 471. As can be appreciated, while mounting a grid array connector on four sides of a chip package provides more connections closer to the chip package and reduces the length of any traces between the chip package and the cable (thus reducing insertion loss to a predetermined level), mounting the grid array connector on a fewer number of sides of the chip package is also contemplated (to have the same number of connections the grid array connector system would naturally have to be larger). In addition, as can be appreciated from FIG. 34, while the depicted grid array connector has 4 cables in each column of cables, some other number of cables can be provided.

Figure 37:
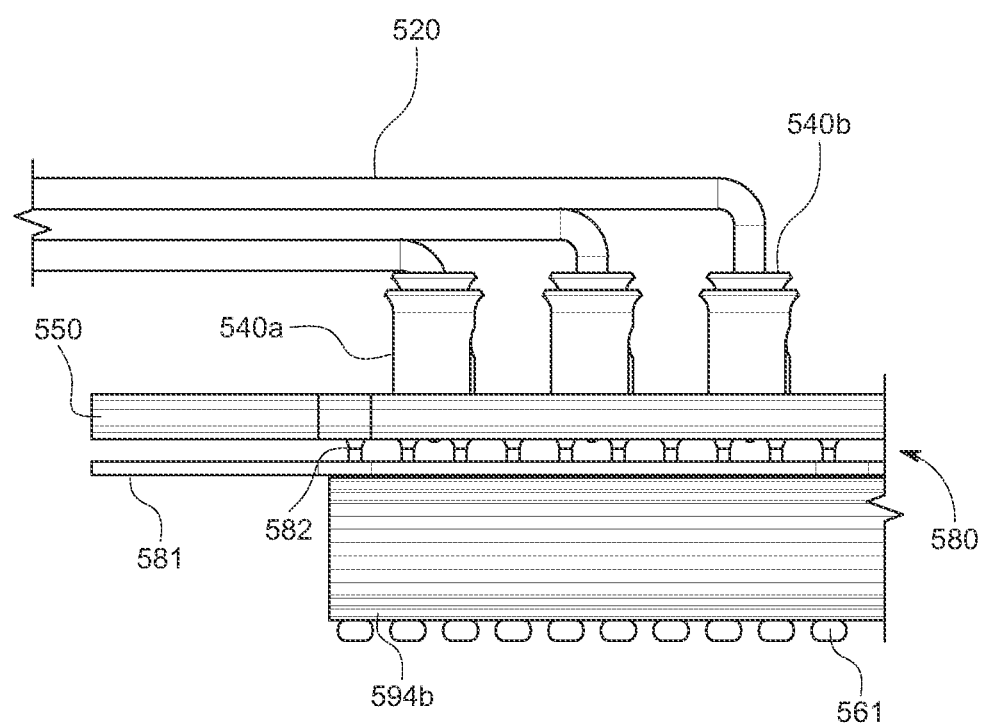
FIG. 37 illustrates a partial elevated side view of an embodiment of grid array connector system showing an alternative interposer construction.
Figure 37A:
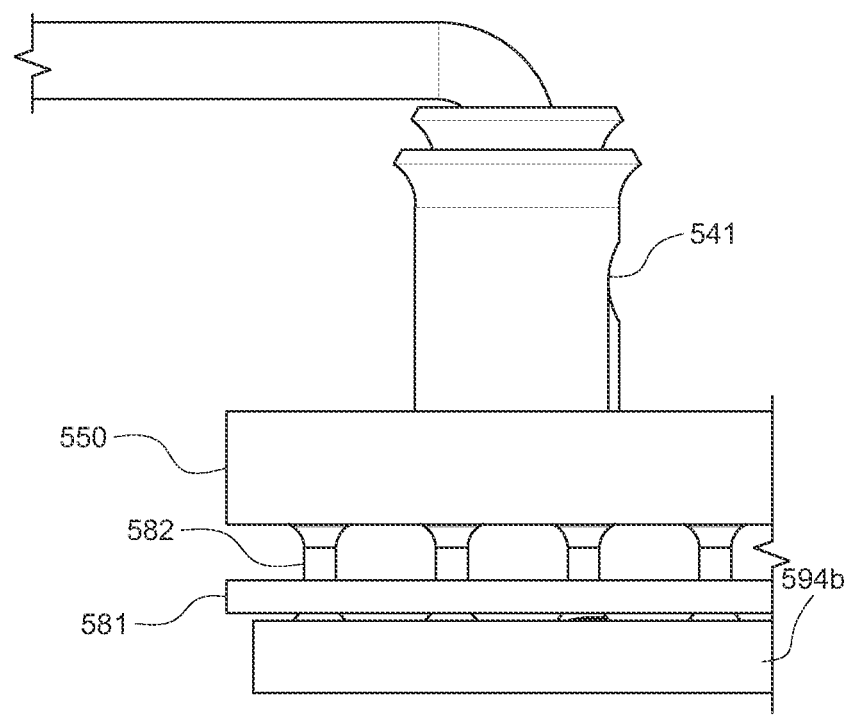
FIG. 37A illustrates an enlarged simplified elevated side view of the embodiment depicted in FIG. 37.
Figure 38:
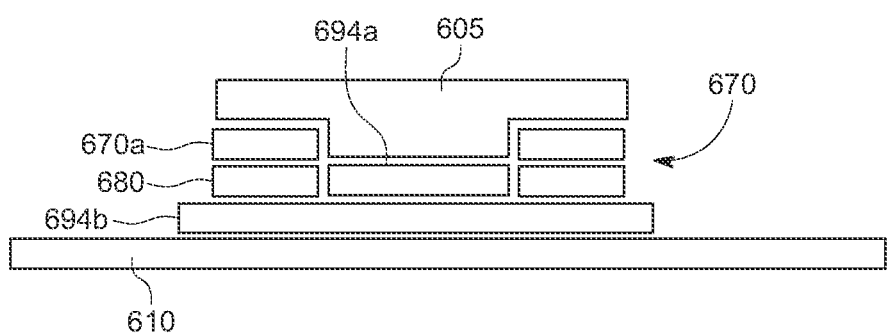
FIG. 38 illustrates a schematic representation of a grid array connector system mounted on a chip substrate.

Turing to FIGS. 37-38, another embodiment of a grid array connector configuration is depicted. The simplified partial depiction in FIG. 37 illustrates a cable 520 connected to a second pedestal 540*b* that is connected to a first pedestal 540*a* that is in turn connected to board 550. Thus, a portion of the design is similar to the previously depicted embodiments. Somewhat differently, however, is an interposer 580 that includes a frame 581 that supports contacts 582 that are in the form of columns. The contacts are intended to be soldered directly to the board 550 and can include a second side that is intended to be soldered to pads on a chip substrate 512. The chip substrate 594*b* is intended to directly support the integrated circuit that is provided in the chip package and would typically connect to a circuit board (not shown) with solder charges 561. The embodiment depicted in FIG. 37-38 therefore illustrates a situation where the grid array connector system can be integrated more closely with the chip package. Naturally such a configuration requires that the chip substrate 594*b* be somewhat larger than ordinarily would be required but the potential for improved electrical performance may make such a configuration desirable. One benefit of such a configuration is that the chip substrate 594*b* can be bounded to the grid array connector system before the integrated circuit was soldered to the chip substrate 594*b*, thus ensuring the integrated circuit is only mounted on functional systems. Naturally, the interposer design depicted in this embodiment could also be used in a more traditional configuration and allow the grid array connector system to be directly soldered to the circuit board.

It should be noted that while the interposer is not required, the use of an interposer can help take up coplanarity on the mating surface(s). An interposer will typically be between 0.3 and 2.0 mm thick, it being understood that a thinner design will reduces compliance and thus makes it more difficult to take up coplanarity while a thicker design takes up more space and eventually becomes less desirable than a connector.

Figure 39:
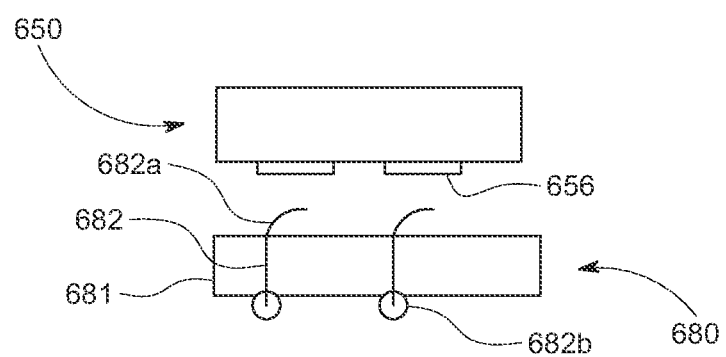
FIG. 39 illustrates a schematic representation of an embodiment of a board connection with an interposer.

FIG. 38 illustrates a schematic representation of an embodiment where the grid array connector system 670 is integrated more closely into the chip package. As depicted, a circuit board 610 supports a chip substrate 694*b*, which in turn supports an integrated circuit 694*a*. An interposer 680 is mounted on the chip substrate 694*b* and is connected to a sub-grid array module 670*a* that include the housing and board and terminated cables. A heat sink 605 is configured to thermally connect to the integrated circuit 694*a* to help dissipate thermal energy. As can be appreciated, the schematic design provides a significant amount of variation. The interposer can be soldered directly to both the board (which is not separately shown) and the chip substrate 494*b* or could just be soldered to one of them and use a contact end that presses against pads on the non-soldered side. An embodiment of a solder side/press side configuration is depicted schematically in FIG. 39 where a board 650 engages an interposer 680. The interposer includes a frame 681 that supports contacts 682 that have a mating end 682*a* that deflects when it engages signal pads 656 and a mating end 682*b* that is configured to soldered to another circuit board or chip substrate. Depending on the configuration, the heat sink can press against the grid array connector system to ensure an electrical connection (typically with the use of a compression member) or can provide clearance to the grid array connector system if the grid array connector system is soldered in place.

Figure 40:
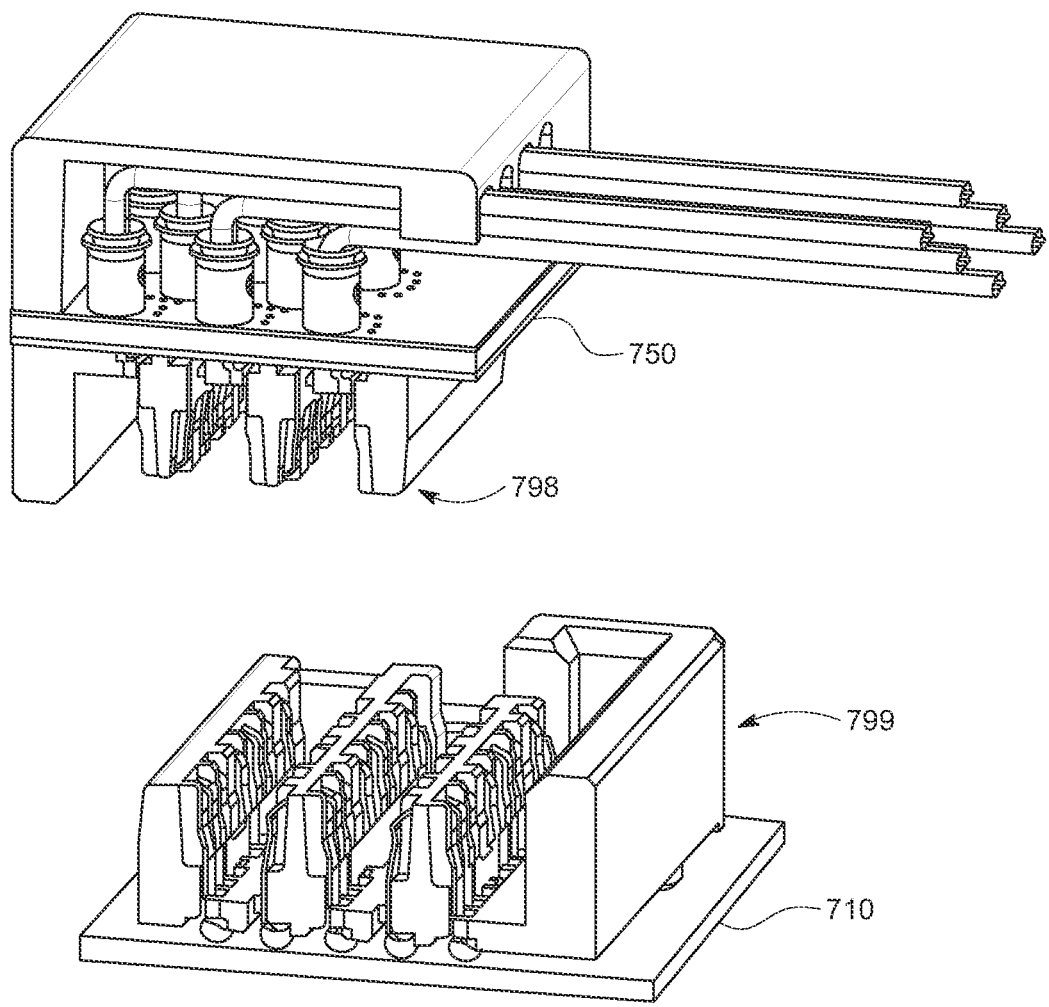
FIG. 40 illustrates a perspective partially exploded view of an embodiment of a grid array connector system that can mate with a circuit board via a mating connector.
Figure 41:
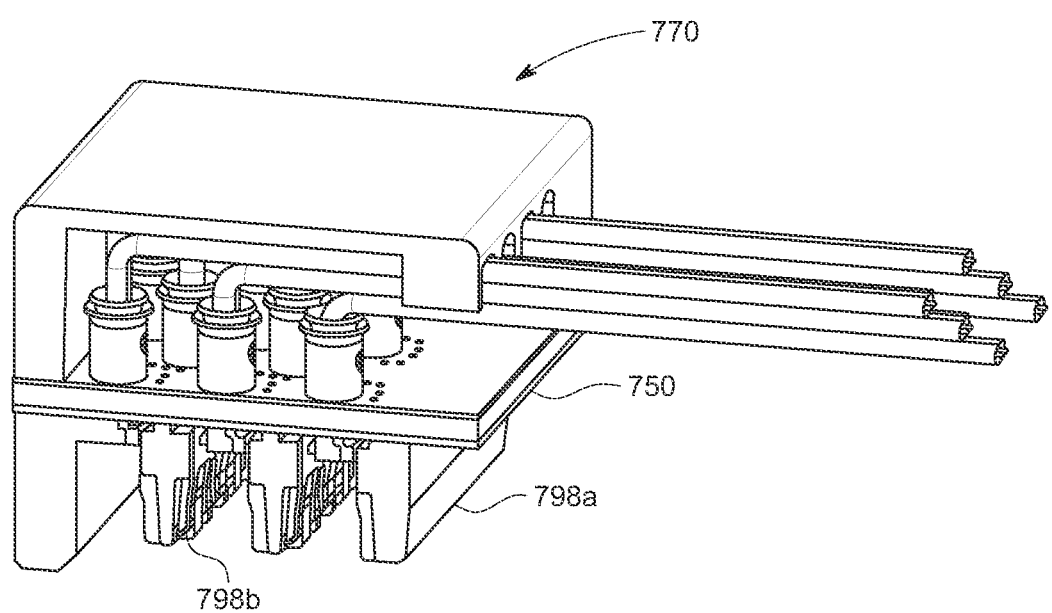
FIG. 41 illustrates a perspective view of the grid array connector system depicted in FIG. 40.
Figure 42:
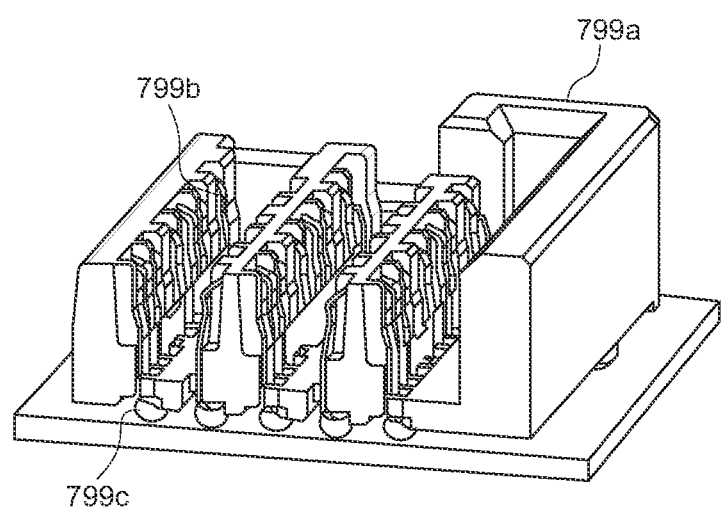
FIG. 42 illustrates a perspective view of the mating connector depicted in FIG. 40

As can be appreciated from FIGS. 40-42, another embodiment of a grid array connector system 770 is depicted that includes a connector 798 mounted to a board 750 and the connector 798 is configured to mate with connector 799 on a circuit board 710. The connector 798 includes a housing 798*a* that supports terminals 798*b* that are connected to the board 750 in a desirable manner (typically with a solder attachment). The connector 799 includes a housing 799*a* that supports terminals 799*b* that are connected to the circuit board 710 via solder connections 799*c*.

Figure 43:
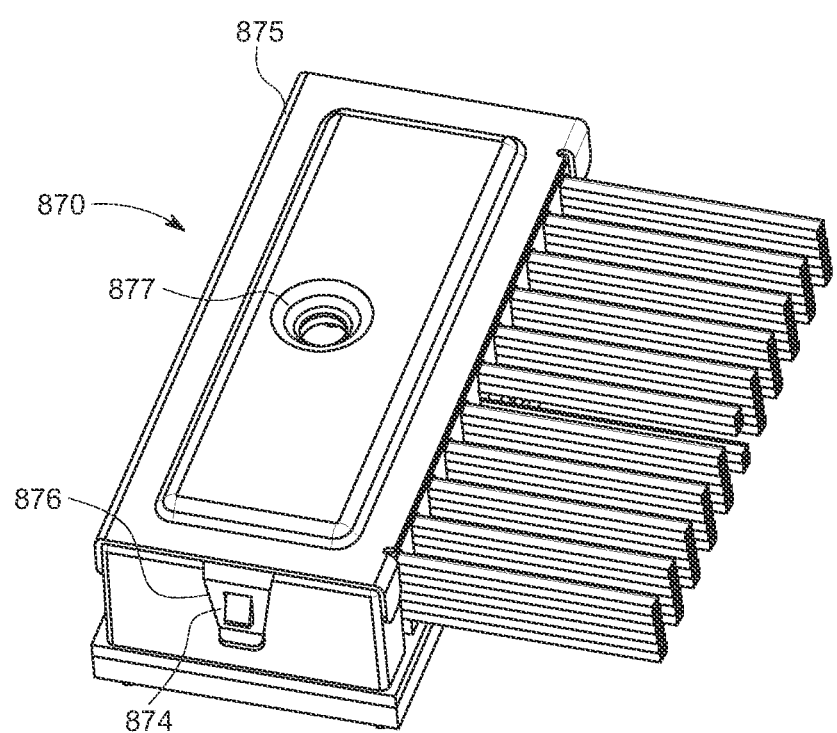
FIG. 43 illustrates a perspective view of an embodiment of a grid array connector system.
Figure 44:
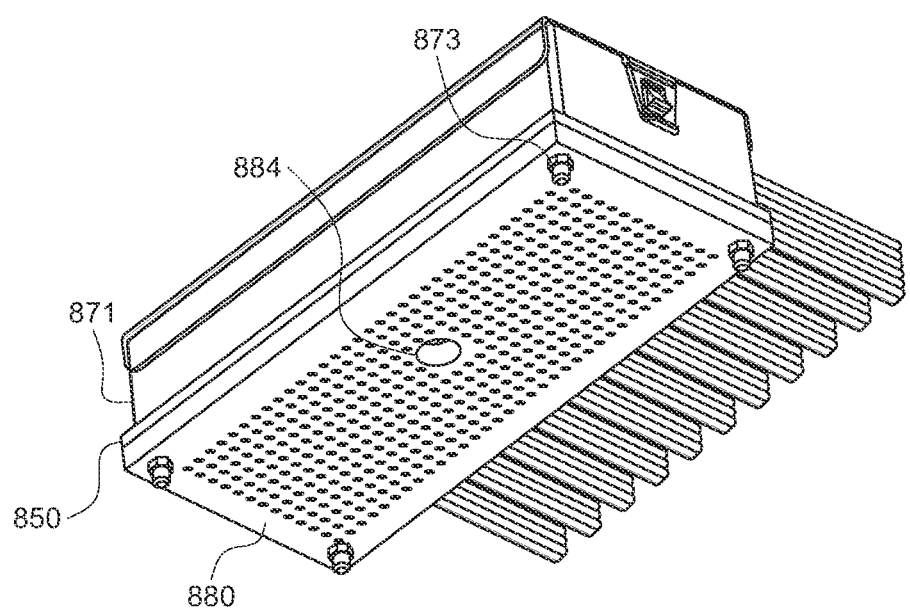
FIG. 44 illustrates another perspective view of the embodiment depicted in FIG. 43.

Another embodiment is depicted in FIGS. 43-44. While the internal construction may be any of the internal designs discussed above, a grid array connector system 870 includes a cover 875 with a fastening aperture 877. The cover 875 includes a latching arm 876 that engages a locking member 874 on housing 871. The fastening aperture 877 is aligned with a fastener opening 884 that extends through the grid array connector system 870, including through the board 850 and an interposer 880. The grid array connector system still has optional pegs 873 to help align it with a mating circuit board but can be retained with a separate fastener. The depicted embodiment thus provides an alternative method of attaching the grid array connector system in place.

FIGS. 45-48 illustrate an embodiment of a compute system 901 which includes the components of FIGS. 28-30, and further includes a compression member 964.1 similar to the compression member 464 provided in FIGS. 31-36. For ease in description, the compute system 901 is described with regard to the orientation shown in FIGS. 45-48, such that the terms "upper", "lower" and the like are used. It is to be understood that other orientations are within the scope of the disclosure.

A heat sink 905 with an attachment member 906 is connected to a lower retaining frame 907 that is positioned on a bottom side 910*b* of a circuit board 910 by retaining legs 908 which extend from the lower retaining frame 907. A chip package 994, and a plurality of upper grid array connector systems 970.1 which are connected to a circuit board 950 are positioned between a top side 910*a* of the circuit board 910 and a lower surface of the heat sink 905. As such, the circuit board 950 is an upper circuit board and the circuit board 910 is a lower circuit board.

The circuit board 950 is like that of the previous embodiments, can be a conventional circuit board or any other desirable substrate such as, without limitation, a ceramic and/or plastic metal composite structure. The circuit board 950 including a mounting surface and a connecting surface with one or more connecting passages 952 extended between the mounting surface and the connecting surface. The circuit board 950 can further include ground planes internally to help provide improved electrical performance.

Each upper grid array connector system 970.1, similar to embodiments discussed above, includes cables 920 that are supported by a housing 971 and is connected to the connecting passages 952 on the circuit board 950 as described above. Like that shown in FIG. 33, the circuit board 950 may be connected to an interposer (shown as interposer 480) with a frame (shown as frame 481) that supports contacts. The upper grid array connector system 970.1 are positioned to form a central passageway 978 between the upper grid array connector system 970.1. The chip package 994 seats within the central passageway 978 formed by the upper grid array connector systems 970.1.

Figure 47:
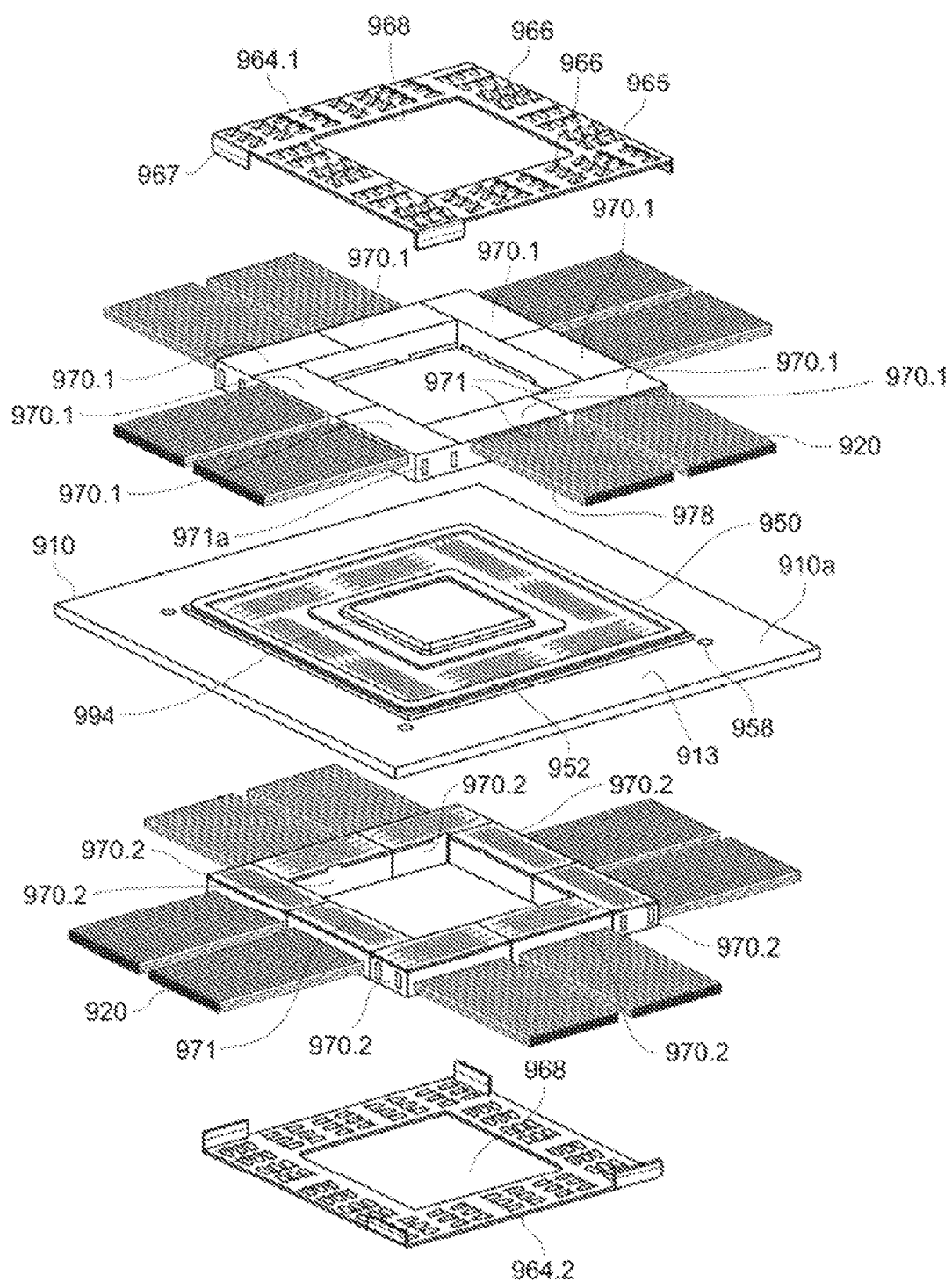
FIG. 47 illustrates an exploded top perspective view of components of the compute system shown in FIG. 45.
Figure 48:
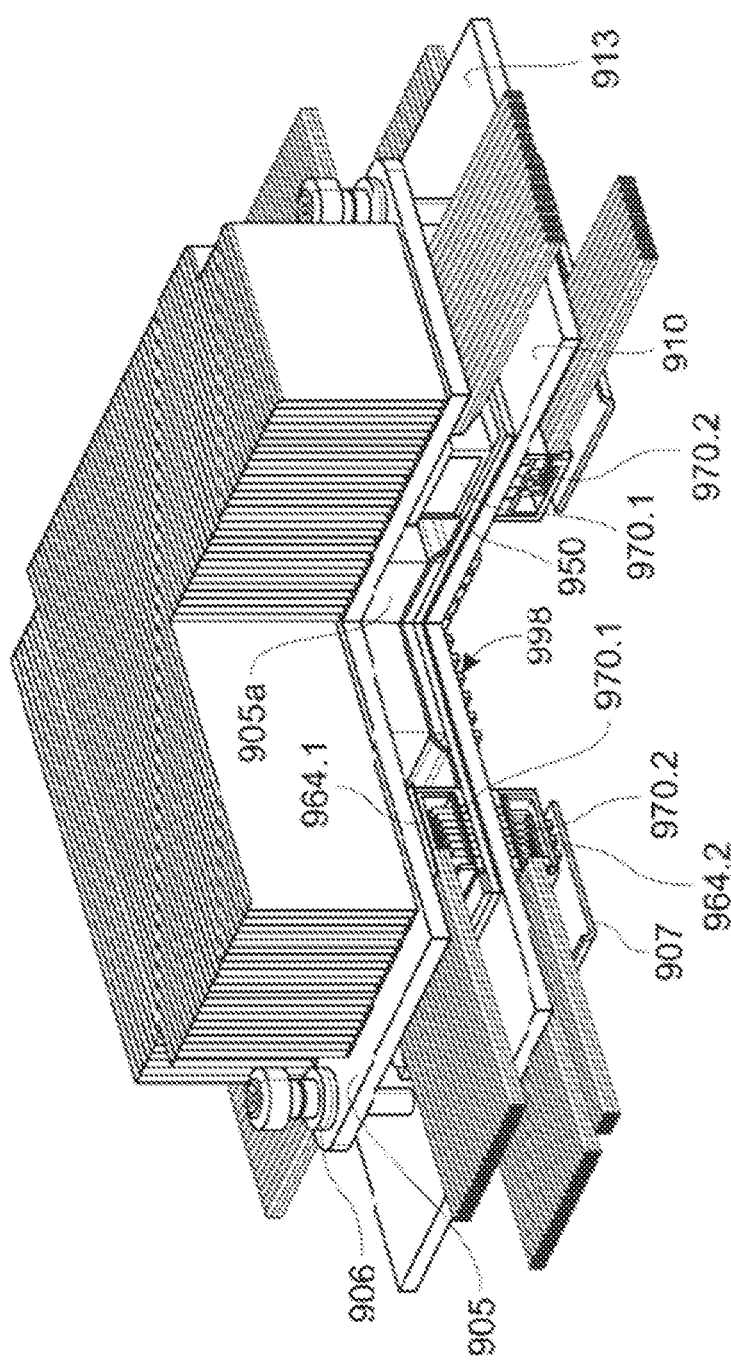
FIG. 48 illustrates a partial cross-sectional view shown from a top perspective view of the compute system shown in FIG. 45.
Figure 49:
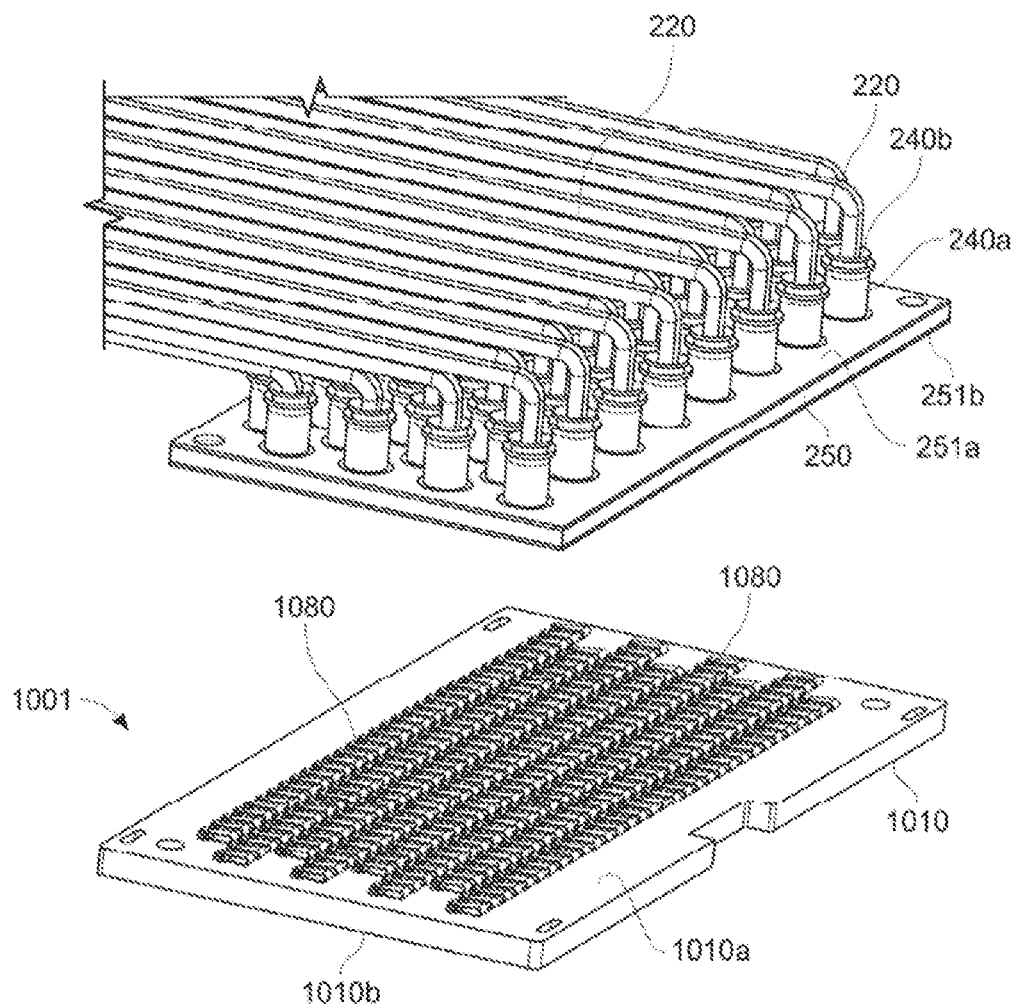
FIG. 49 is an exploded top perspective view of components of an embodiment of a compute system.
Figure 50:
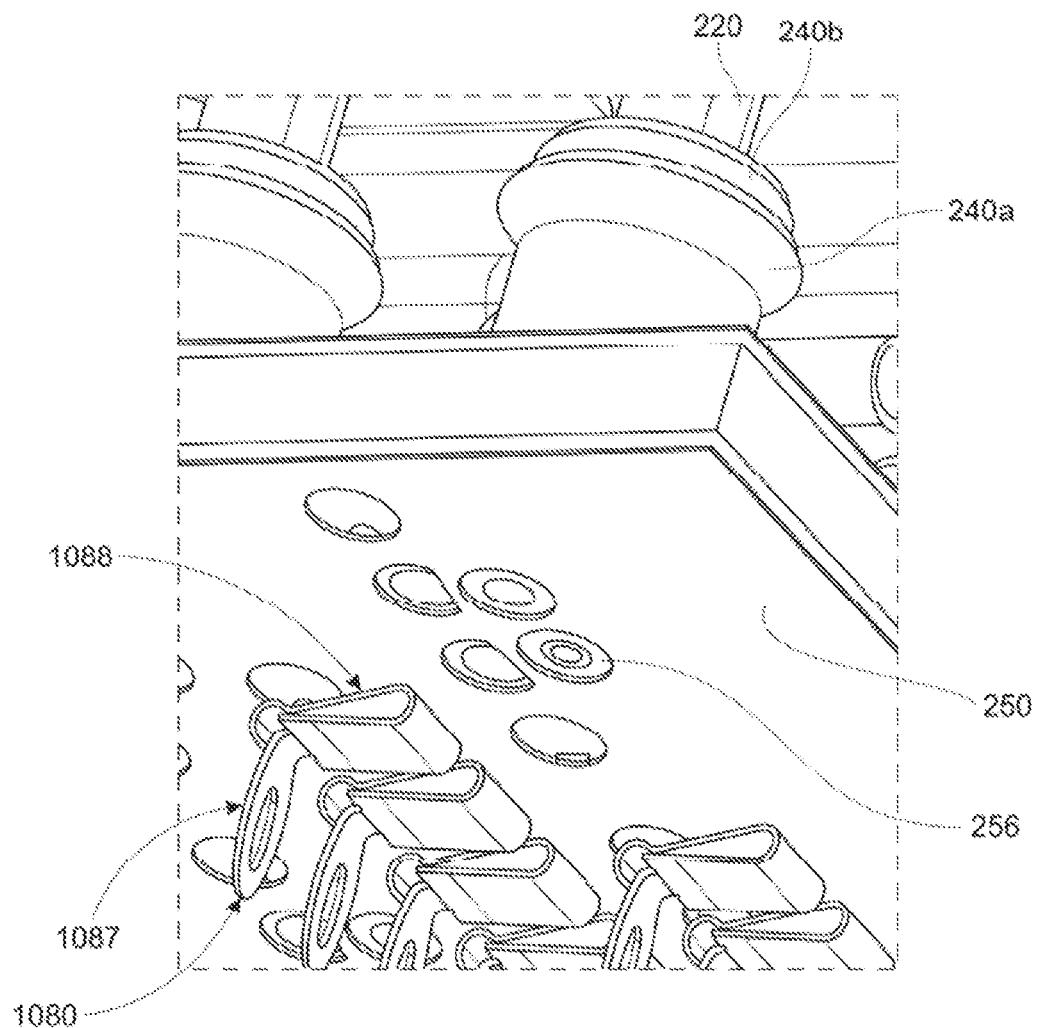
FIG. 50 is an exploded bottom perspective view of components of the compute system shown in FIG. 49.
Figure 51:
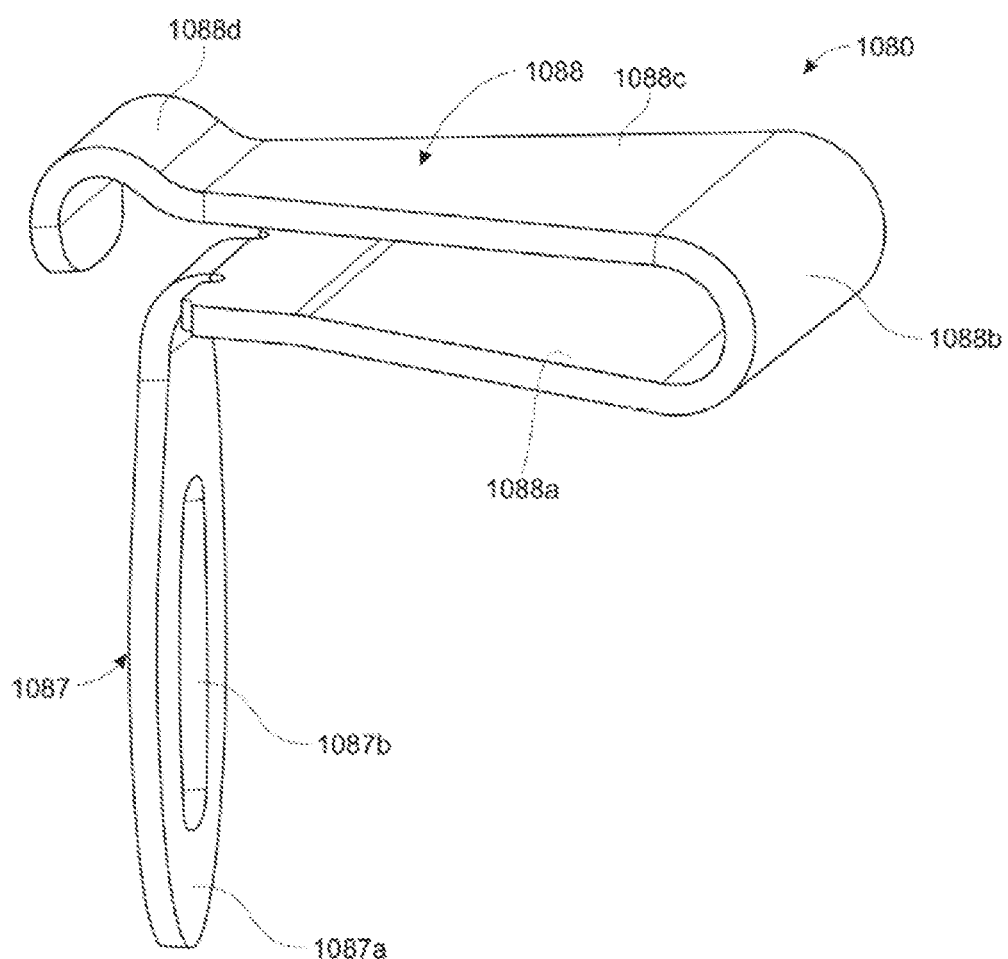
FIG. 51 is a top perspective view of a terminal of the compute system shown in FIG. 49.

The circuit board 910 includes a substrate 911 having a connection area 998 aligned with the chip package 994 to provide for additional signal paths to other components (or to mount components under the chip package 994). The connection area 998 is at a center portion of the substrate 911. As shown in FIG. 47, the circuit board 950 is mounted at the center of the substrate 911 above the connection area 998 and above a portion of the circuit board 910 which is outwardly of the connection area 998, but the circuit board 950 does not overlap the entire substrate 911 of the circuit board 910. As such, a portion of the substrate 911 extends a predetermined distance outwardly from each edge of the circuit board 950, thereby providing a stiffening ring 913. The stiffening ring 913 provides stiffening, flattening and strengthening for the connecting passages 952 on the circuit board 950 to which the upper grid array connector system 970.1 are connected, and the chip package 994 mounted thereon. Since the connecting passages 952 on the circuit board 950 surround the chip package 994, the stiffening ring 913 provides for planarity of the connecting passages 952 on the circuit board 950. The substrate 911 further has alignment apertures 958 through which the alignment pegs 973 extend. The alignment apertures 958 are provided through the stiffening ring 913 such that the alignment apertures 958 are outward of the circuit board 950, but the alignment apertures 958 do not interfere with the properties provided by the stiffening ring 913.

The heat sink 905 includes a projection 905a that designed to press against the chip package 994 so as to ensure there is good thermal connection between the heat sink 905 and the chip package 994. To ensure there is a sufficiently efficient thermal connection between the heat sink 905 and the chip package 994, one can include some sort of thermal interface material (TIM), which could be a paste or other suitable material. If greater thermal efficiency is required, the chip package 994 could be directly soldered to the heat sink 905. As can be appreciated, the heat sink 905 presses against both the chip package 994 and the upper grid array connector systems 970.1, and thus helps ensure both are firmly pressed into place and a reliable connection is maintained.

Figure 33:
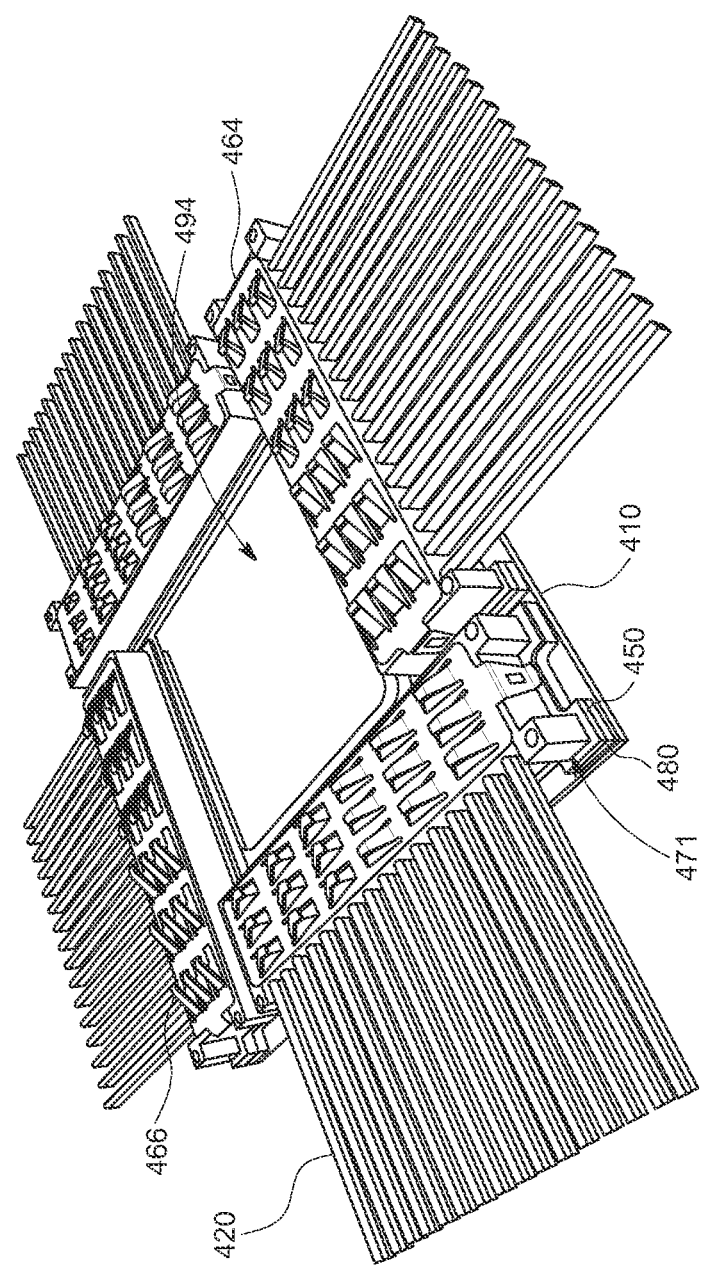
FIG. 33 illustrates a perspective view of an embodiment of a chip package and a plurality of grid array connector systems.
Figure 34:
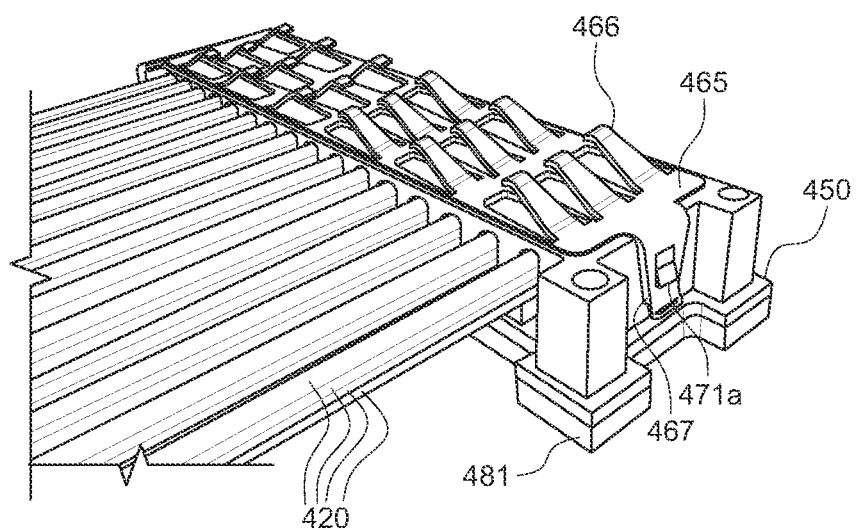
FIG. 34 illustrates a perspective view of a grid array connector system depicted in FIG. 33.
Figure 35:
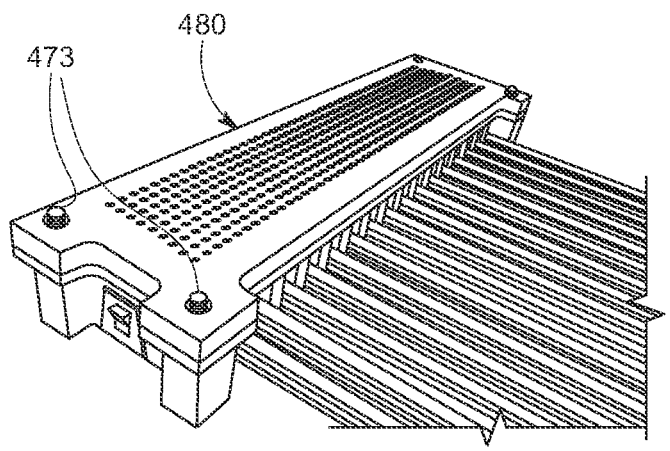
FIG. 35 illustrates another perspective view of the embodiment depicted in FIG. 34.
Figure 36:
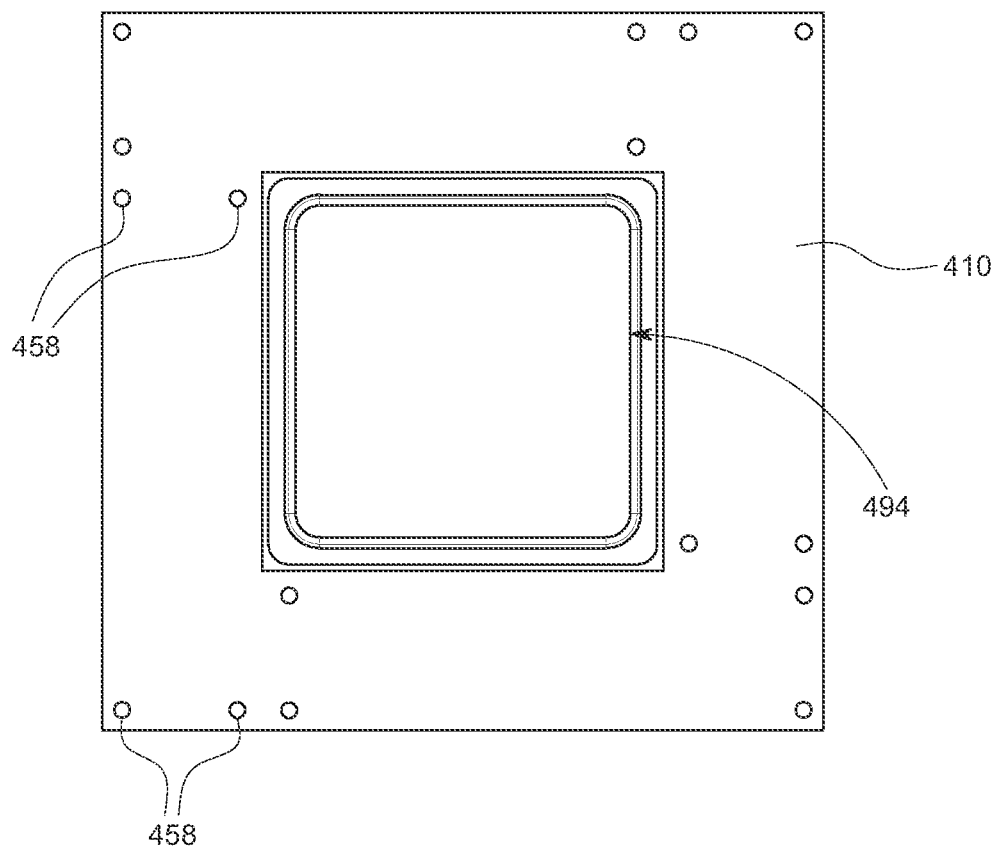
FIG. 36 illustrates a plan view of an embodiment of a chip package mounted on a circuit board that could be used with the embodiment depicted in FIG. 33.

As can be appreciated, it is desirable for the interface between the chip package 994 and the heat sink 905 to define the vertical position of the heat sink 905 as the thermal connection between the chip package 994 and the heat sink 905 influences the amount of heat that can be removed from the chip package 994. The depicted compute system 901 includes an upper compression member 964.1 that ensures that the heat sink 905 presses on the grid array connector systems 970.1 with the desired force (and thus can tolerate variations in the vertical position of the heat sink 905 relative to the circuit board 910). The compression member 964 includes a base 965 with compression fingers 966 extending from an upper surface thereof and latch arms 967 extending from a lower surface thereof. The latch arms 967 engage latch catches 971a on the housings 971 to secure the compression member 964 to the housings 971. The base 965 abuts against the housings 971 and the compression fingers 966 engage a lower surface of the heat sink 905. The compression member 964 differs from the compression members 464 shown in FIG. 33 in that a single compression member 964 is secured to all of the grid array connector systems 970.1, instead of individual compression members 464 as shown in FIG. 33. The single compression member 964 of this embodiment has a continuous base 965 that has a cutout 968 in the center which is larger than the outer perimeter of the chip package 994. The compression fingers 966 are provided around the base 965 such that compression fingers 966 are provided above each housing 971. In an embodiment, the cutout 968 conforms the shape of the outer perimeter of the chip package 994. In an embodiment, the cutout 968 is square. The compression member 964 preferably includes multiple latch arms 967 which engage with respective latch catches 971a.

As can be appreciated, while mounting grid array connector systems 970.1 on four sides of the chip package 994 provides more connections closer to the chip package 994 and reduces the length of any traces between the chip package 994 and the cables 920 (thus reducing insertion loss to a predetermined level), mounting grid array connector systems 970.1 on a fewer number of sides of the chip package 994 is also contemplated (to have the same number of connections the grid array connector system 970.1 would naturally have to be larger).

The embodiment of the compute system 901 shown in FIGS. 45-48 further includes a plurality of lower grid array connector systems 970.2 and a lower compression member 964.1 between the bottom side 910b of the circuit board 910 and the lower retaining frame 907.

The lower retaining frame 907 includes a cutout 915 through a central portion of the lower retaining frame 907.

Each of the lower grid array connector systems 970.2 may be connected to the circuit board 910 in a manner similar to that of previous embodiments, or may be directly connected to the circuit board 910. Each lower grid array connector system 970.2, similar to embodiments discussed above, includes cables 920 that are supported by a housing 971 and are connected to the circuit board 910. The positions of the lower grid array connector systems 970.2 may mirror the positions of the of upper grid array connector systems 970.1.

The lower compression member 964.2 may be identically formed to the upper compression member 964.1 and as such, the specifics are not described. In use, the lower compression member 964.2 is flipped relative to the upper compression member 964.1. The lower compression member 964.2 biases the lower grid array connector systems 970.2 into engagement with the circuit board 910.

To form the compute system 910, the chip package 994, the upper grid array connector systems 970.1 and the circuit board 950 are electrically connected to the circuit board 910. The upper compression member 964.1 is attached to the housings 971 of the upper grid array connector systems 970.1. The heat sink 905 is seated on top of the upper compression member 964.1 and the projection 905a on the heat sink 905 passes through the cutout 968 in the upper compression member 964.1 and through the central passageway 978 formed by the upper grid array connector systems 970.1 to engage the upper surface of the chip package 994. The lower grid array connector systems 970.2 are electrically connected to the circuit board 910, and the lower compression member 964.2 is attached to the housings 971 of the lower grid array connector systems 970.2. The lower retaining frame 907 is then attached to the heat sink 905 by passing the retaining legs 908 of the lower retaining frame 907 through the alignment apertures 958 in the circuit board 910. The retaining legs 908 are engaged by the attachment member 906 of the heat sink 905 to form a sandwich construction. The connection area 998 of the circuit board 910 can be accessed from below the compute system 901 through the cutout 915 in the lower retaining frame 907 and through the cutout 968 in the lower compression member 964.2.

Figure 45:
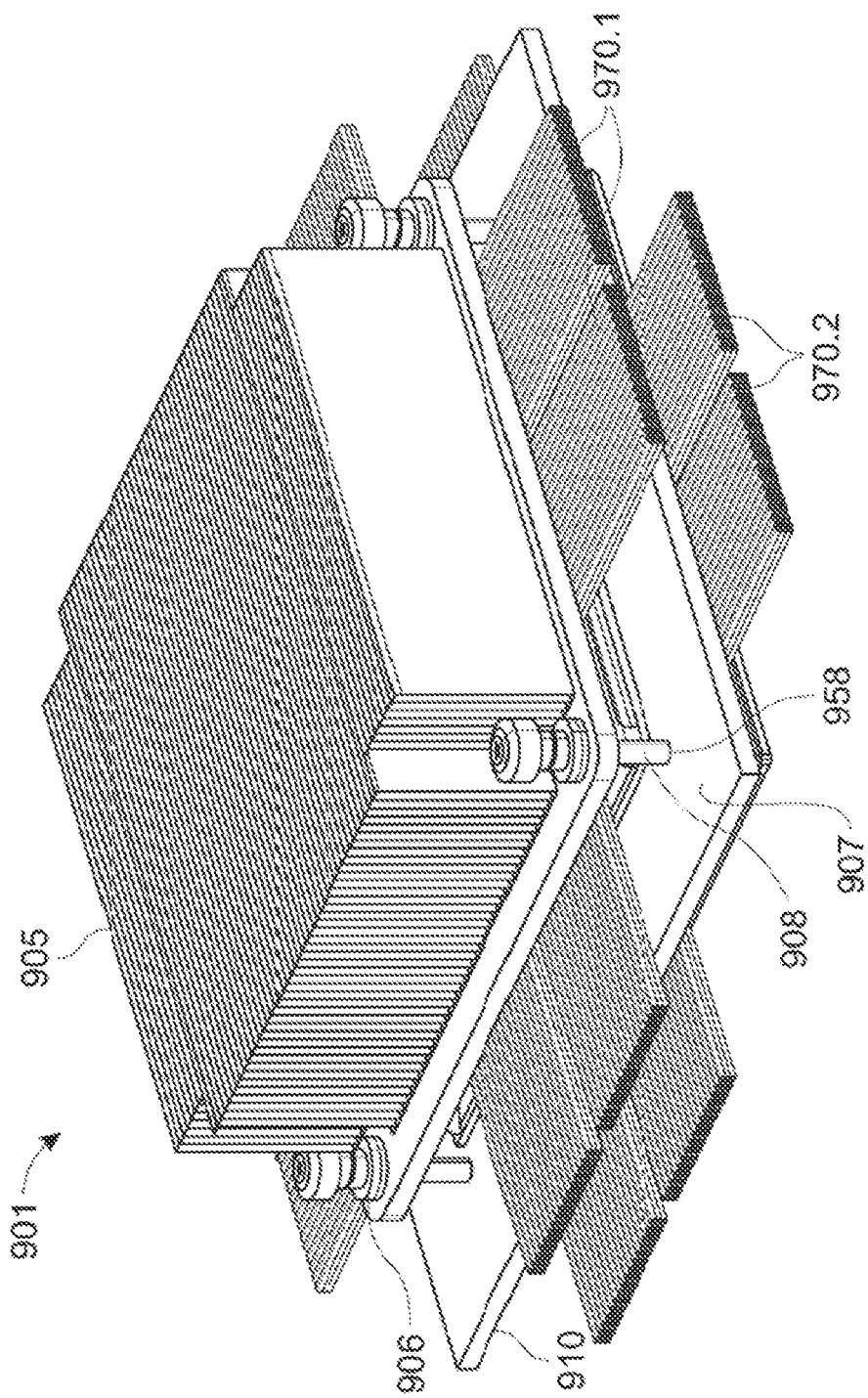
FIG. 45 illustrates a top perspective view of an embodiment of a compute system.
Figure 46:
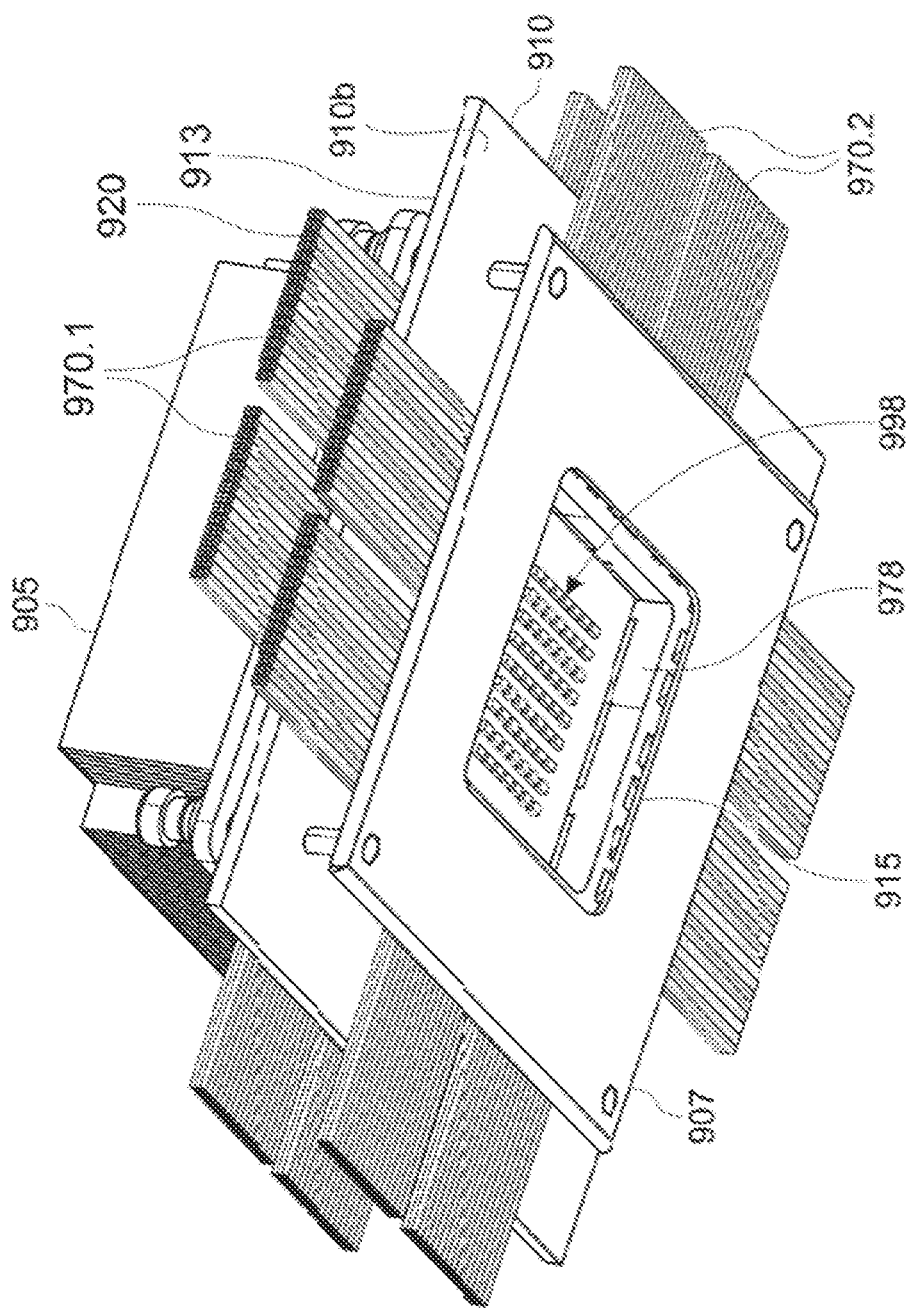
FIG. 46 illustrates a bottom perspective view of the embodiment of the compute system shown in FIG. 45.

FIGS. 49-53 illustrate another embodiment of a compute system 1001 like that of the embodiments shown in FIGS. 29 and 45 (the chip package is not shown in FIGS. 49-53). The compute system 1001 includes the grid array connector system 270, except that the interposer 280 is not provided. As such, the cables 220 are terminated directly to the circuit board 250 in the manner described with regard to FIGS. 1-7 and FIGS. 17-27C and the specifics are not repeated herein. The compute system 1001 further includes a second circuit board 1010 to which each cable 20 is connected by a conductive terminal 1080. The conductive terminal 1080 is used in place of the interposer 280 in this embodiment.

Figure 52:
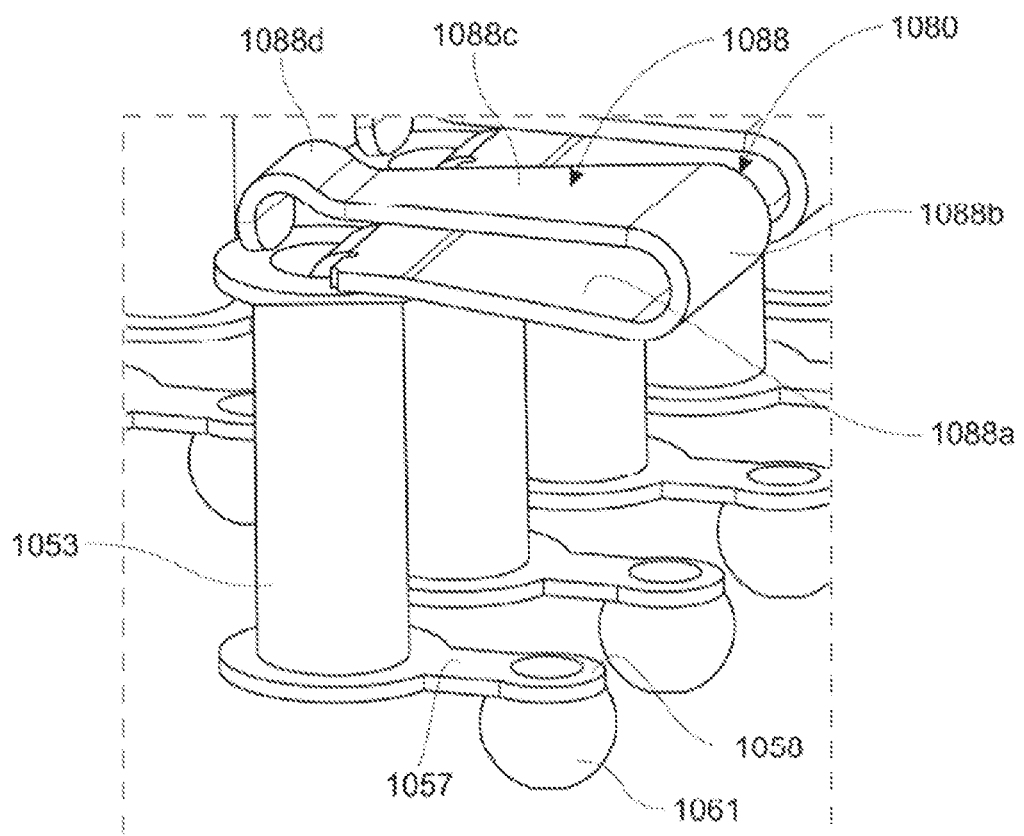
FIG. 52 is an assembled top perspective view of components of the compute system shown in FIG. 49.
Figure 53:
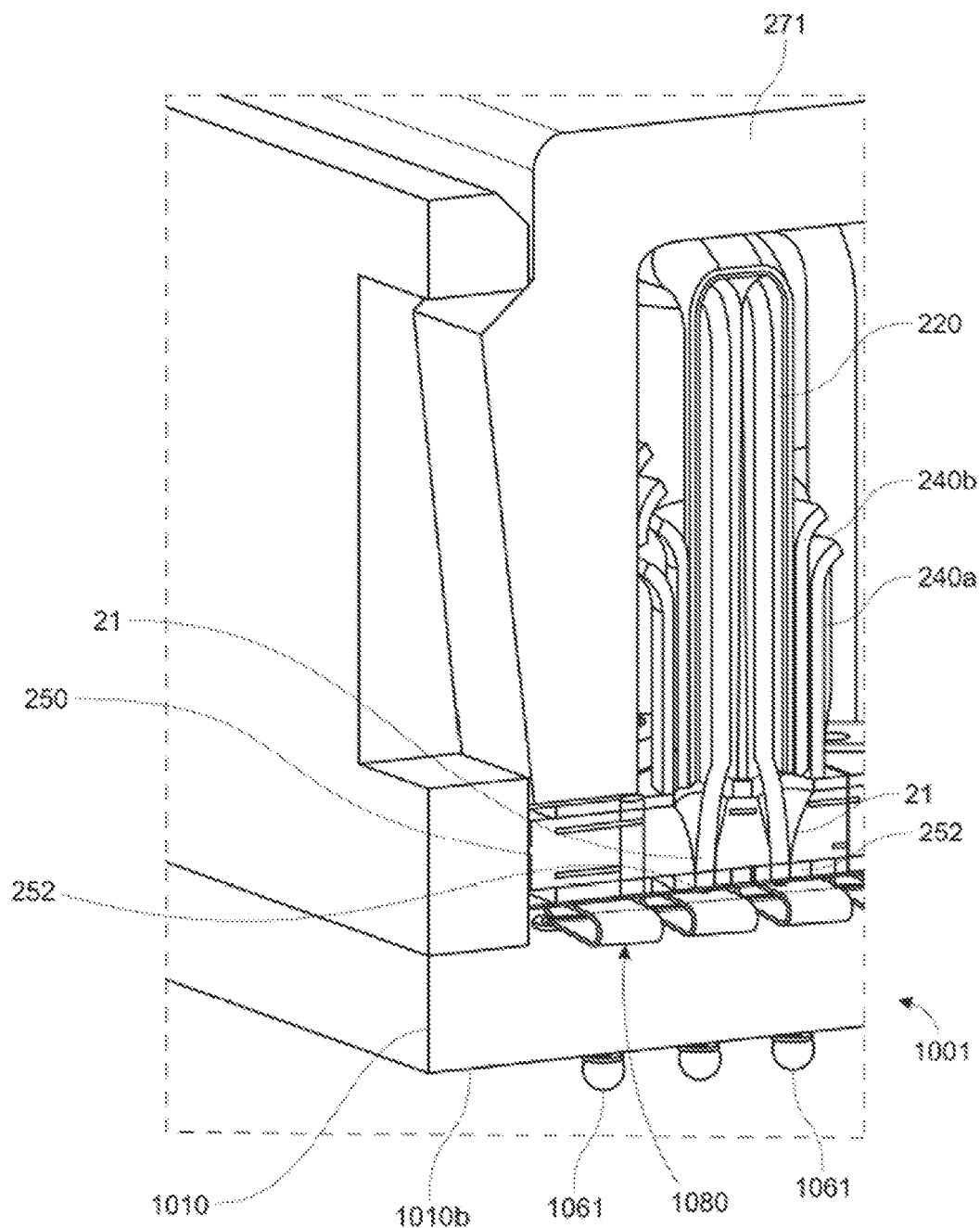
FIG. 53 illustrates a partial cross-sectional view shown from a top perspective view of the compute system shown in FIG. 49.
Figure 54:
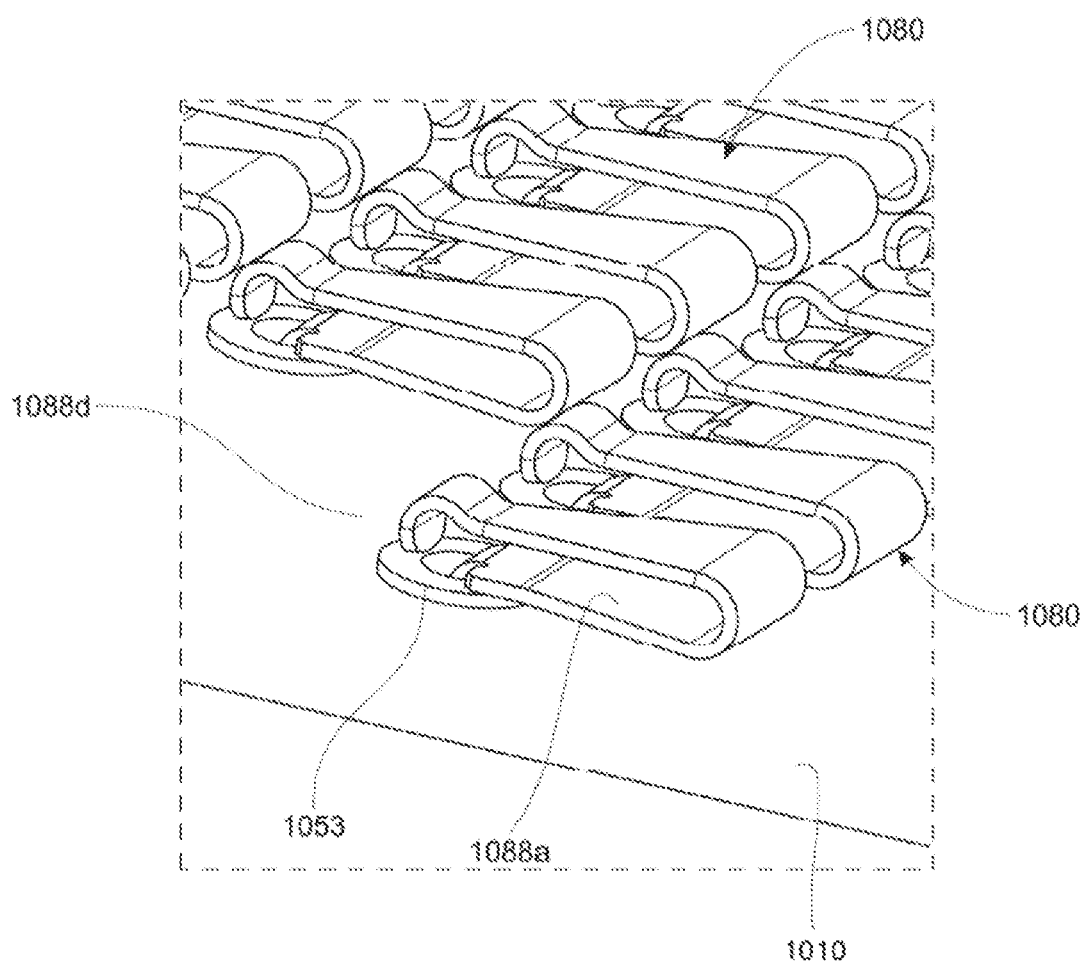

The second circuit board 1010, like that of circuit boards 210, 310, 410, 610, 710, can be a conventional circuit board or any other desirable substrate such as, without limitation, a ceramic and/or plastic metal composite structure. The circuit board 1010 includes a mounting surface 1010a and a connecting surface 1010b with one or more connecting passages having a conductive support via 1053 therein and which extends therebetween. The support vias 1053, in an embodiment, are cylindrical. In an embodiment, each support via 1053 can be connected by a short trace 1057 to a signal pad 1058 on the connecting surface 1010 of the circuit board 1010, as is illustrated in FIG. 52, and a solder charge 1061, which can be a solder ball, can be positioned on the signal pads 1058. Alternatively, the solder charge 1061 can be positioned on the end of the support via 1053 at the connecting surface 1010 and the trace 1057 eliminated.

Each terminal 1080 includes a press-fit portion 1087 and a deflectable portion 1088. The press-fit portion 1087 is sized to conform to the inner dimension of the support via 1053 when inserted into the support via 1053. When inserted, the press-fit portion 1087 contacts the support via 1053 such that an electrical connection is achieved.

In the illustrated embodiment, the press-fit portion 1087 is formed of an elongated circle or oval shaped body 1087a having an opening 1087b therethrough. The body 1087a can be larger than the inner dimension of the support via 1053 such that the body 1087b is deformed and collapsed on itself to reduce the diameter of the opening 1087b when the press-fit portion 1087 is inserted into the support via 1053. In an embodiment, the deflectable portion 1088 is formed from a bent back arm having a hooked end. As shown, the bent back arm is formed of a first portion 1088a which extends from an end of the body 1087a and is perpendicular to the body 1087a, a second curved portion 1088b which extends from the opposite end of the first portion 1088a, a third portion 1088c which extends from the opposite end of the second curved portion 1088b and overlaps the first portion 1088a such that the third portion 1088c is "doubled-back" over the first portion 1088a by the curved portion 1088b. The hooked end is formed from a hooked end portion 1088d which extends from the opposite end of the third portion 1088c and extends past the press-fit portion 1087 a predetermined distance. The free end of the hooked end portion 1088d faces the body 1087a and the support via 1053. The deflectable portion 108 extends outward from the support via 1053 as shown in FIG. 52 (FIG. 52 only shows the support vias 1053 and does not show circuit board 1010).

When the circuit board 250 is mated with the circuit board 1010, the signal pads 256 on the connecting surface 251b of the circuit board 250 connect to the third portion 1088c of the deflectable portions 1088 of the terminals 1080. The doubled-back third arm 1088c and the hooked end 1088d deflect toward the first arm 1088a. Preferably, the hooked end 1088d engages with the support via 1053 when the deflectable portion 1088 is deflected. The engagement of the hooked end 1088d with the support via 1053 provides several advantages. The engagement causes a wiping action on the support via 1053. In addition, when the hooked end 1088d directly engages the support via 1053, the electrical path through the terminal 1080 provided with another path since signals can now pass from the cable 220, along the third arm portion 1088c to the hooked end 1088d and then to the support via 1053. In the event that the hooked end 1088d does not engage with the support via 1053, the electrical path through the terminal 1080 is maintained.

Other shapes for the deflectable portion 1088 that allow for deflection are contemplated. For example, the deflectable portion 1088 may be formed of a V-shaped first portion having a pair of arms and which extends from an end of the body 1087a, a second inverted V-shaped portion having a pair of arms and extending from the first portion, and an opening. When the deflectable portion 1088 is engaged by the circuit board 250, the first and second pairs of arms flatten to at least partially close the opening such that the first pair of arms engage the support via 1053 and the second pair of arms engage the signal pad 256.

The use of the press-fit portion 1087 provides for a much easier assembly than welding the terminal 1080 to the second circuit board 1050. In addition, since the terminal 1080 is not welded to the second circuit board 1050, the solder charge 61 can be directly welded to the signal via 1053. The provision of the deflectable portion 1088 also for irregularities in the circuit boards 210, 1010 to be accommodated, while still providing a reliable electrical path between the circuit boards 210, 1010.

As can be appreciated from the various embodiments depicted herein, different features of different embodiments depicted herein can be combined together the form additional combinations. For example, the grid array connector system internal design depicted in FIGS. 1-7 could be used as an alternative to the internal design depicted in 20-25. Similarly, the various interposer configurations could be used (or omitted), depending on the application and system requirements. As a result, the embodiments depicted herein are particularly suitable to provide a wide range of configurations that were not all depicted individually so as to avoid repetitiveness and unnecessary duplication.

The disclosure provided herein describes features in terms of preferred and exemplary embodiments thereof. Numerous other embodiments, modifications and variations within the scope and spirit of the appended claims will occur to persons of ordinary skill in the art from a review of this disclosure.

We claim:

1. A compute system comprising:
   a substrate supporting an integrated circuit, the substrate having a first side and a second side, the substrate having a plurality of vias and having a first set of terminals positioned in some of the plurality of vias, the first set of terminals each having a deflectable contact on the first side; and
   a first grid array connector positioned on the first side, the first grid array connector supporting a first plurality of cables that are terminated to the first grid array connector, the first plurality of cables configured to each provide a differential signal path, the first grid array connector configured to electrically connect conductors in the first plurality of cables to the deflectable contacts of the first set of terminals so that the conductors in the first plurality of cables are in electrical communication with the integrated circuit.

2. The compute system of claim 1, wherein the substrate includes a second set of terminals positioned in others of the plurality of vias, the second set of terminals having deflectable contact on the second side.

3. The compute system of claim 2, further comprising a second grid array connector positioned on the second side, the second grid array connector supporting a second plurality of cables that are terminated to the first grid array connector, the second plurality of cables configured to each provide a differential signal path, the second grid array connector configured to electrically connect conductors in the second plurality of cables to the deflectable contacts of the second set of terminals so that the conductors in the second plurality of cables are in electrical communication with the integrated circuit.

4. The compute system of claim 3, further comprising:
a first compression member positioned on the first grid array connector; and
a heat sink that compresses the first compression member so as to bias the first grid array connector toward the deflectable contacts, the heat sink further configured to transfer thermal energy from the integrated circuit.

5. The compute system of claim 4, further comprising a second compression member positioned on the second grid array connector and a retaining frame configured to press against the second compression member, wherein the second compression member urges the second grid array connector toward the deflectable contacts provided on the second side of the substrate.

6. The compute system of claim 1, further comprising
a first compression member positioned on the first grid array connector; and
a heat sink that compresses the first compression member so as to bias the first grid array connector toward the deflectable contacts, the heat sink further configured to transfer thermal energy from the integrated circuit.

7. A compute system comprising:
a lower circuit board with a plurality of vias;
a plurality of terminals positioned in the plurality of vias, each of the terminals including a press-fit portion that is inserted into one of the corresponding vias and a deflectable portion; and
an upper circuit board with a first surface and a second surface, the upper circuit board having a plurality of conductors terminated thereto via the first surface, the conductors each electrically connected to a pad on the second surface, wherein the pads are configured to electrically engage the deflectable portion of the corresponding terminal.

8. The compute system of claim 7, further comprising an integrated circuit mounted on the lower circuit board, the integrated circuit being in communication with the plurality of vias.

9. The compute system of claim 8, further comprising a housing that helps support the plurality of conductors and a compression member configured to bias the housing and the pads on the second surface toward the deflectable portion of the plurality of terminals.

10. The compute system of claim 9, further comprising a heat sink that compresses the compression member, the heat sink further configured to transfer thermal energy from the integrated circuit.

* * * * *